US012745412B2

(12) United States Patent
Pan et al.

(10) Patent No.: US 12,745,412 B2
(45) Date of Patent: Sep. 22, 2026

(54) SEMICONDUCTOR STRUCTURE WITH HARD MASK AND METHOD FOR MANUFACTURING THE SAME

(71) Applicant: Taiwan Semiconductor Manufacturing Company, Ltd., Hsinchu (TW)

(72) Inventors: Kuan-Ting Pan, Taipei City (TW); Kuo-Cheng Chiang, Zhubei City (TW); Shi-Ning Ju, Hsinchu City (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 707 days.

(21) Appl. No.: 18/152,421

(22) Filed: Jan. 10, 2023

(65) Prior Publication Data

US 2024/0234537 A1 Jul. 11, 2024

(51) Int. Cl.
*H10D 30/01* (2025.01)
*H10D 30/43* (2025.01)
(Continued)

(52) U.S. Cl.
CPC ........... *H10D 30/014* (2025.01); *H10D 30/43* (2025.01); *H10D 30/6735* (2025.01);
(Continued)

(58) Field of Classification Search
CPC .. H10D 30/014; H10D 30/43; H10D 30/6735; H10D 30/6739; H10D 62/121;
(Continued)

(56) References Cited

U.S. PATENT DOCUMENTS 9,209,247 B2 12/2015 Colinge et al.
9,236,267 B2 1/2016 De et al.
(Continued)

OTHER PUBLICATIONS

Pauliac-Vaujour, S., et al. "Improvement of high resolution lithography by using amorphous carbon hard mask." Microelectronic engineering 85.5-6 (2008): 800-804. (Year: 2008).*
(Continued)

*Primary Examiner* — Norman D Richards
*Assistant Examiner* — Ethan Edward Cutler
(74) *Attorney, Agent, or Firm* — Birch, Stewart, Kolasch & Birch, LLP

(57) ABSTRACT

A method for manufacturing a semiconductor structure includes forming fins over a substrate. Each of the fins includes a base fin protruding from the substrate, and first semiconductor layers and second semiconductor layers alternating stacked over the base fin. The method further includes forming an isolation structure between the base fins, forming a hard mask layer over the isolation structure, and removing the second semiconductor layers, so that the first semiconductor layers and the hard mask layer are exposed in a gate trench. The method further includes forming a gate structure in the gate trench. The gate structure wraps around the first semiconductor layers and over the hard mask layer.

20 Claims, 29 Drawing Sheets

(51) Int. Cl.

| | |
|---|---|
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.
CPC ....... *H10D 30/6739* (2025.01); *H10D 62/121* (2025.01); *H10D 62/151* (2025.01); *H10D 64/01318* (2026.01); *H10D 64/017* (2025.01); *H10D 64/018* (2025.01); *H10D 84/0167* (2025.01); *H10D 84/017* (2025.01); *H10D 84/0177* (2025.01); *H10D 84/0188* (2025.01); *H10D 84/038* (2025.01); *H10D 84/85* (2025.01)

(58) Field of Classification Search
CPC .. H10D 62/151; H10D 64/017; H10D 64/018; H10D 84/0167; H10D 84/017; H10D 84/0177; H10D 84/0188; H10D 84/038; H10D 84/85; H10D 30/6757; H10D 30/797; H01L 21/28088
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 * | 12/2016 | Chang | H10D 84/038 |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2002/0098676 | A1 * | 7/2002 | Ning | H10B 61/00 257/E27.005 |
| 2019/0109204 | A1 * | 4/2019 | Cheng | H10D 84/0167 |
| 2021/0225839 | A1 * | 7/2021 | Lin | H10D 84/834 |
| 2021/0320210 | A1 * | 10/2021 | Lin | H10D 30/6757 |

OTHER PUBLICATIONS

Westwood, W. D. "Physical vapor deposition." Microelectronic Materials and Processes. Dordrecht: Springer Netherlands, 1989. 133-201. (Year: 1989).*

* cited by examiner 100
302
310
308
306
402
304
702
108
902
102
1002N
802
106
102A
502
1002P
1002N
802
102A
102B
902
402
202
Z
X
Y

SEMICONDUCTOR STRUCTURE WITH HARD MASK AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) devices have been incorporated into memory devices (including, for example, static random-access memory, or SRAM, cells) and core devices (including, for example, standard logic, or STD, cells) to reduce chip footprint while maintaining reasonable processing margins. However, as GAA devices continue to be scaled down, conventional methods for manufacturing GAA devices may experience challenges. Accordingly, although existing technologies for fabricating GAA devices have been generally adequate for their intended purposes, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1E-2, 1F-2, 1G-2, 1H-2, 1I-2, 1J-2, 1K-2, 1L-2, and 1M-2 are X-Z cross-sectional views of the workpiece at various fabrication stages along a line B-B' of FIG. 1D, in accordance with some embodiments of the present disclosure.

FIG. 1W-1 is a Y-Z cross-sectional view of the workpiece at a fabrication stage along a line D-D' of FIG. 1V, in accordance with some embodiments of the present disclosure.

FIG. 1W-2 is an X-Z cross-sectional view of the workpiece at a fabrication stage along a line E-E' of FIG. 1V, in accordance with some embodiments of the present disclosure.

FIG. 1W-3 is a Y-Z cross-sectional view of the workpiece 100 at a fabrication stage along a line F-F' of FIG. 1V, in accordance with some embodiments of the present disclosure.

FIG. 1W-4 is an X-Z cross-sectional view of the workpiece at a fabrication stage along a line G-G' of FIG. 1V, in accordance with some embodiments of the present disclosure.

FIG. 2 is a Y-Z cross-sectional view of the workpiece along a line D-D' of FIG. 1V, in accordance with some embodiments of the present disclosure.

FIG. 3 is a Y-Z cross-sectional view of the workpiece along a line D-D' of FIG. 1V, in accordance with some embodiments of the present disclosure.

FIG. 4 is a Y-Z cross-sectional view of the workpiece along a line D-D' of FIG. 1V, in accordance with some embodiments of the present disclosure.

DETAILED DESCRIPTION

Figure 1A:
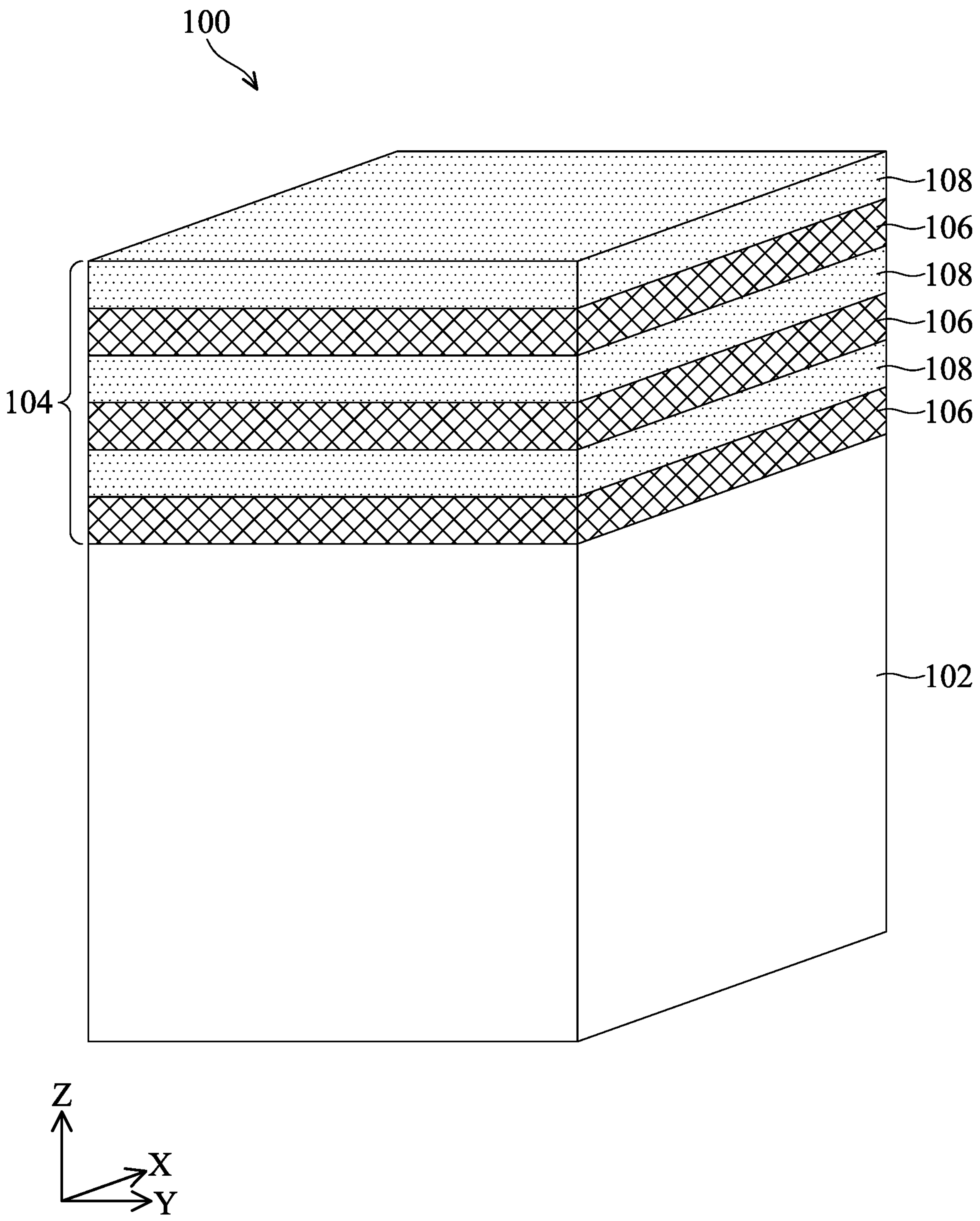
FIGS. 1A, 1B, 1C, and 1D are perspective views of a workpiece at various fabrication stages, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor structures, and more particularly to semiconductor structures with field-effect transistors (FETs), such as three-dimensional gate-all-around (GAA) transistors, in memory (e.g., SRAM) and/or standard logic cells of an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications. While existing technologies for fabricating GAA transistors have been generally adequate for their intended applications, they have not been entirely satisfactory in all aspects. Specifically, due to loss of materials of isolation structures between base fins protruded from a substrate during nanosheet release process, gate structure may extend deeply between base fins, such that undesired parasitic capacitances are produced to degrade performance of the GAA transistors in memory (e.g., SRAM) and/or standard logic cells.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including hard mask layers over isolation structure to prevent loss of materials of the isolation structure for performance improvement. The details of the structure and manufacturing methods of the present disclosure are described below in conjunction with the accompanying drawings, which illustrate the process of making GAA transistors, according to some embodiments.

FIGS. 1A to 1D are perspective views of a workpiece 100 at various fabrication stages, in accordance with some embodiments of the present disclosure. Referring to FIGS. 1A, a workpiece 100 is provided. As shown in FIG. 1A, the workpiece 100 includes a substrate 102 and a stack 104 over the substrate 102. In some embodiments, the substrate 102 contains a semiconductor material, such as bulk silicon (Si). In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure or a germanium-on-insulator (GOI) structure. In some embodiments, the substrate 102 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion. In some embodiments, n-type wells have an n-type dopant concentration of about $5\times10^{16}$ $cm^{-3}$ to about $5\times10^{19}$ $cm^{-3}$, and p-type wells have a p-type dopant concentration of about $5\times10^{16}$ $cm^{-3}$ to about $5\times10^{19}$ $cm^{-3}$.

The stack 104 includes semiconductor layers 106 and 108, and the semiconductor layers 106 and 108 are alternatingly stacked in a Z-direction. The semiconductor layers 106 and the semiconductor layers 108 may have different semiconductor compositions. In some embodiments, semiconductor layers 106 are formed of silicon germanium (SiGe) and the semiconductor layers 108 are formed of silicon (Si). In these embodiments, the additional germanium content in the semiconductor layers 106 allow selective removal or recess of the semiconductor layers 106 without substantial damages to the semiconductor layers 108, so that the semiconductor layers 106 are also referred to as sacrificial layers. In some embodiments, the semiconductor layers 106 and 108 are epitaxially grown over (on) the substrate 102 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 106 and the semiconductor layers 108 are deposited alternatingly, one-after-another, to form the stack 104. It should be noted that three (3) layers of the semiconductor layers 106 and three (3) layers of the semiconductor layers 108 are alternately and vertically arranged (or stacked) as shown in FIG. 1A, which are for illustrative purposes only and not intended to be limiting beyond what is specifically recited in the claims. The number of layers depends on the desired number of channels members for the semiconductor device. In some embodiments, there may be from 2 to 10 semiconductor layers 106 alternating with 2 to 10 semiconductor layers 108 in the stack 104.

Figure 1B:
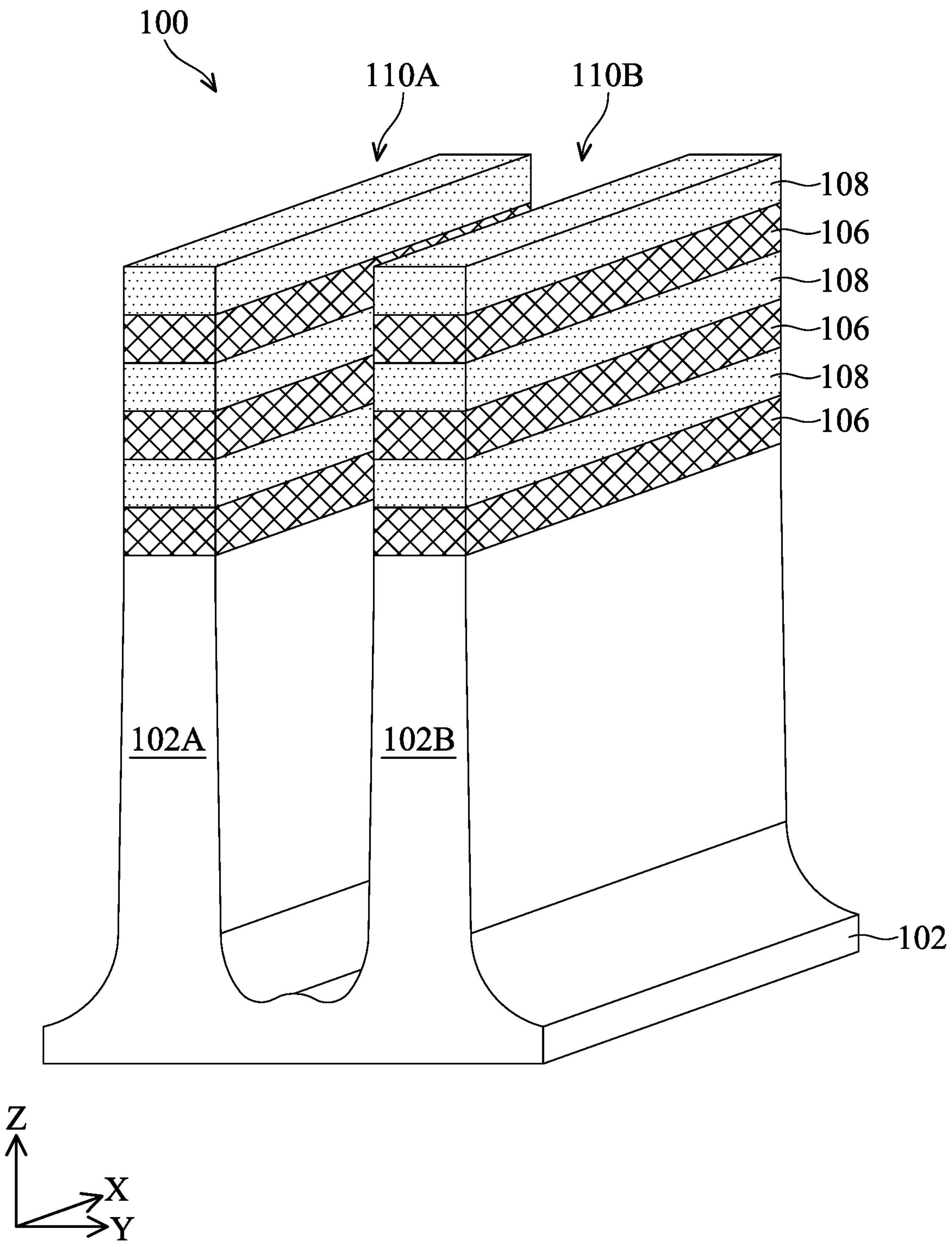

Referring to FIG. 1B, the substrate 102 and the stack 104 are then patterned to form fins 110A and 110B (may be collectively referred to as fins 110) over the substrate 102. As shown in FIG. 1B, each of the fins 110 includes a base fin (102A and 102B) formed from a portion of the substrate 102 and a stack portion formed from the stack 104 over the base portion. The base fins 102A and 102B protrude from the substrate 102. Each of the fins 114 extends lengthwise in an X-direction and extends vertically in the Z-direction over the substrate 102, and arranged in a Y-direction. In some embodiments, widths of the fins 114 along a Y-direction are the same. Although the two fins 110A and 110B are formed and shown herein, more fins may be formed, such as three or more fins.

The fins 110 may be patterned using suitable processes including double-patterning or multi-patterning processes. For example, in some embodiments, a material layer is formed over a substrate and patterned using a photolithography process. Spacers are formed alongside the patterned material layer using a self-aligned process. The material layer is then removed, and the remaining spacers, or mandrels, may then be used to pattern the fins 110 by etching the stack 104 and the substrate 102. The etching process may include dry etching, wet etching, reactive ion etching (RIE), and/or other suitable processes.

Figure 1C:
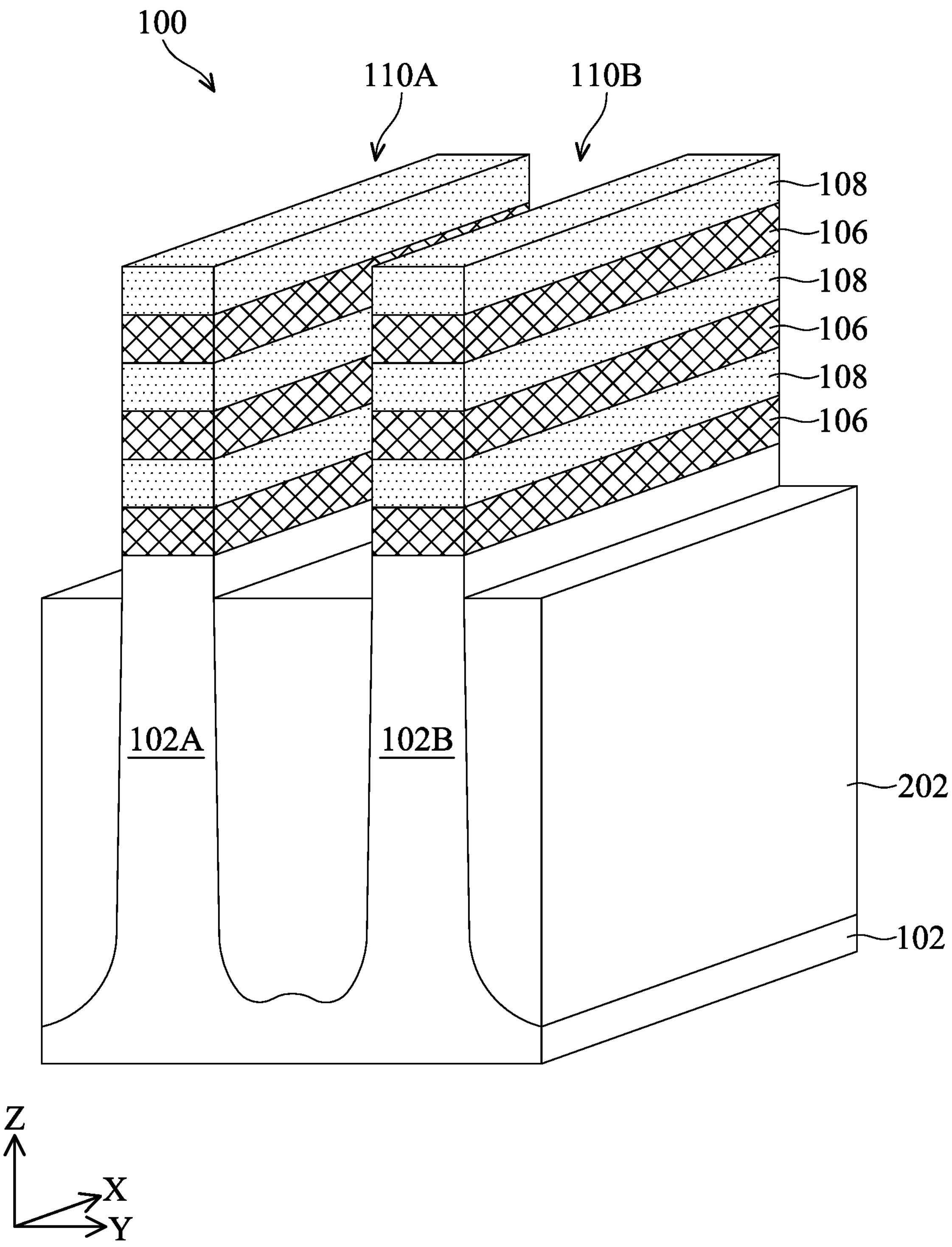

Referring to FIG. 1C, an isolation structure 202 is formed. After the fins 110 are formed, the isolation structure 202 is formed over the substrate 102. In some embodiments, the isolation structure 202 is formed between the fins 110. In some other aspects, the isolation structure 202 is formed around the fins 110. More specifically, the isolation structure 202 is formed between and around the base fins (e.g., 102A and 102B) of the fins 110. The isolation structure 202 may also be referred to as shallow trench isolation (STI) feature. In some embodiments, a dielectric material for the isolation structure 202 is first deposited over the workpiece 100. Specifically, the dielectric material is deposited and formed over the fins 110 and the substrate 102 to cover the fins 110 and the substrate 102. In some aspects, the dielectric material is formed to wrap around the fins 110. In some embodiments, the dielectric material may include silicon oxide, silicon nitride, silicon oxynitride, fluorine-doped silicate glass (FSG), a low-k dielectric, combinations thereof, and/or other suitable materials. In various embodiments, the dielectric material may be deposited by a CVD, a subatmospheric CVD (SACVD), a flowable CVD (FCVD), an ALD, spin-on coating, and/or other suitable process. The deposited dielectric material is then thinned and planarized, for example by a chemical mechanical polishing (CMP) process. The planarized dielectric material is further recessed by a dry etching process, a wet etching process, and/or a combination thereof to form the isolation structure 202. As shown in FIG. 1C, the stack portions of the fins 110 rise above the isolation structures 202 while the base fins 102A and 102B are surrounded by the isolation structures 202. In other words, top surfaces (or topmost surfaces) of the substrate 102 are higher than top surfaces of the isolation structure 202. In some embodiments, before the formation of the isolation structure 202, a liner layer may be conformally deposited over the substrate 202 using ALD or CVD.

Figure 1D:
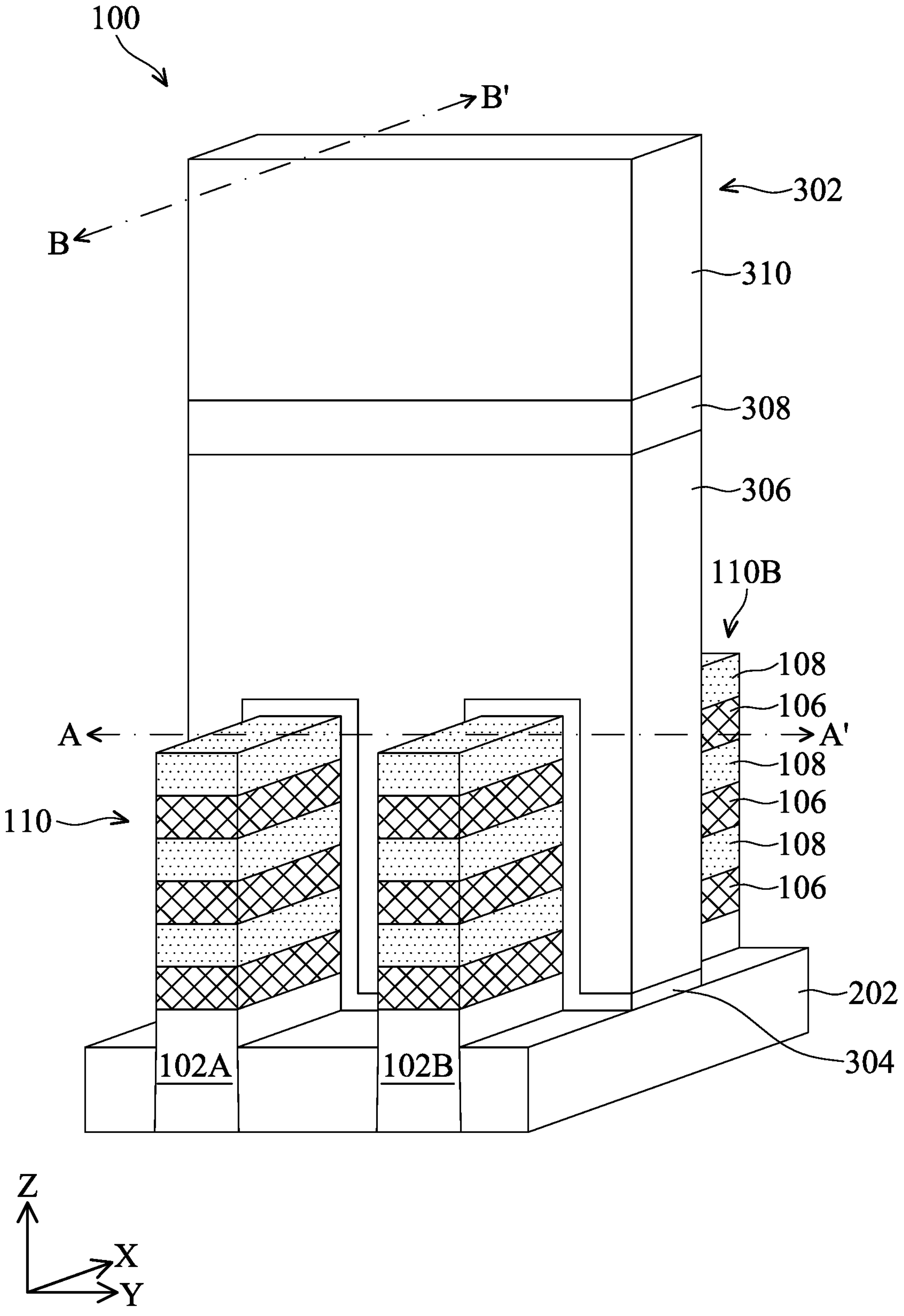

Referring to FIG. 1D, a dummy gate structure 302 may be formed over the fin 110 and over the isolation structure 202. The dummy gate structure 302 may be configured to extend lengthwise in the Y-direction and wrap around the top surface and side surfaces of the fins 110. In some embodiments, to form the dummy gate structure 302, a dummy interfacial material of a dummy interfacial layer 304 is first formed over fins 110 and over the isolation structure 202. More specifically, the dummy interfacial material is conformally formed on sidewalls of the fins 110 and over top surfaces of the fins 110 and the isolation structure 202, as shown in FIG. 1D. In some embodiments, the dummy interfacial layer 304 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material of a dummy gate electrode 306 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material and/or the dummy interfacial material may be formed by way of a thermal oxidation process and/or a deposition process (e.g., physical vapor deposition (PVD), CVD, PECVD, and ALD).

Then, hard mask layers 308 and 310 are formed over the dummy gate material. In some embodiments, the hard mask layers 308 and 310 may be formed using photolithography and removal (e.g., etching) processes. In some embodiments, the hard mask layers 308 and 310 may include photoresist materials or hard mask materials. In some embodiments, the hard mask layer 308 may be a silicon nitride layer and the hard mask layer 310 may be a silicon oxide layer. After the formation of the hard mask layers 308 and 310, lithography and etching processes may be performed to remove portions of the dummy gate material for the dummy gate electrode 306 and the dummy interfacial material for the dummy interfacial layer 304 that are not directly underlie the hard mask layers 308 and 310, thereby forming the dummy gate structure 302 having the dummy interfacial layer 304, the dummy gate electrode 306, and the hard mask layers 308 and 310. The dummy interfacial layer 304 may also be referred to as dummy gate dielectric. The dummy gate structure 302 may undergo a gate replacement process through subsequent processing to form metal gates, such as a high-k metal gate, as discussed in greater detail below.

FIG. 1D shows one dummy gate structure 302. In some embodiments, more dummy gate structures may be formed for more transistors sharing source/drain regions. In other embodiments, some dummy gate structures may also undergo a gate replacement process to form dielectric based gates that electrically isolate transistors formed by the dummy gate structure 302 from neighboring transistors or devices.

Figures 1, 1E, 2:
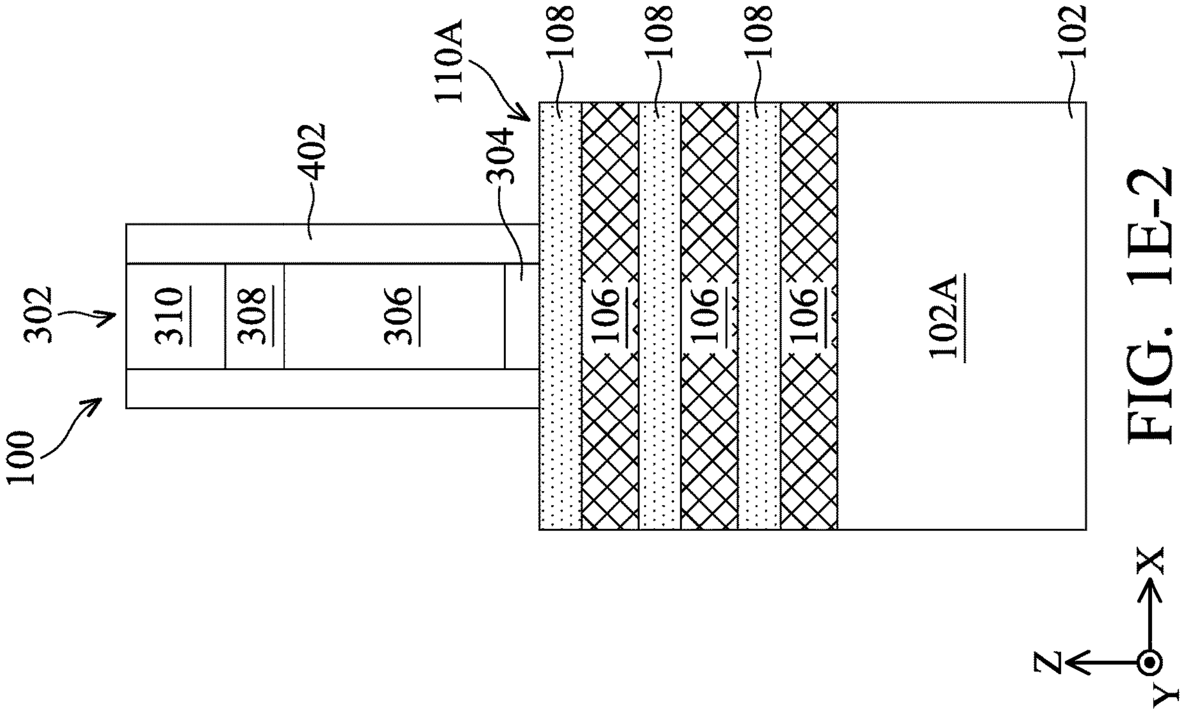
Figures 1, 1E:
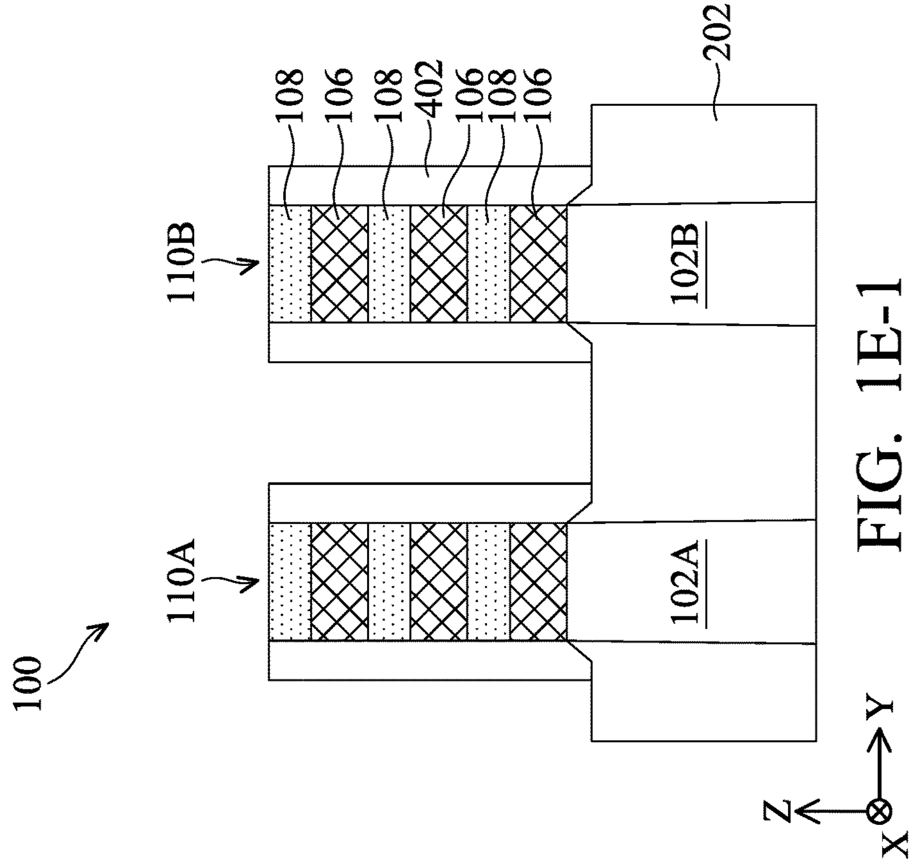
FIGS. 1E-1, 1F-1, 1G-1, 1H-1, 1I-1, 1J-1, 1K-1, 1L-1, and 1M-1 are Y-Z cross-sectional views of the workpiece at various fabrication stages along a line A-A' of FIG. 1D, in accordance with some embodiments of the present disclosure.
Figures 1, 1F, 2:
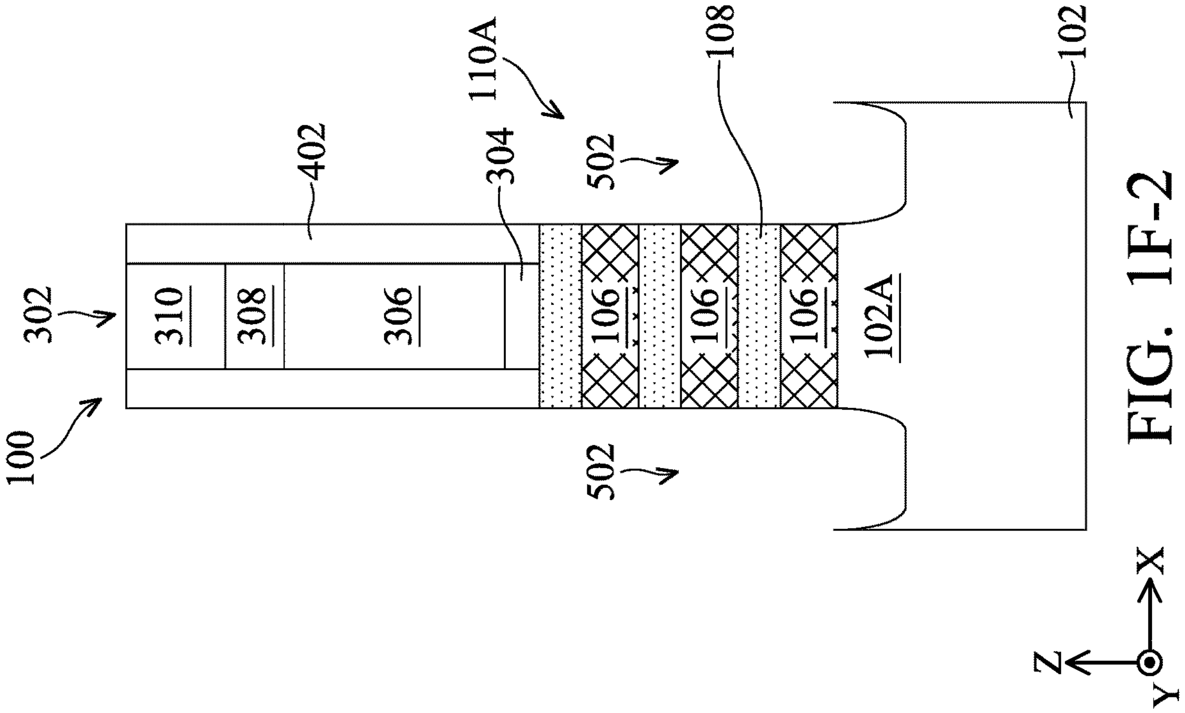
Figures 1, 1F:
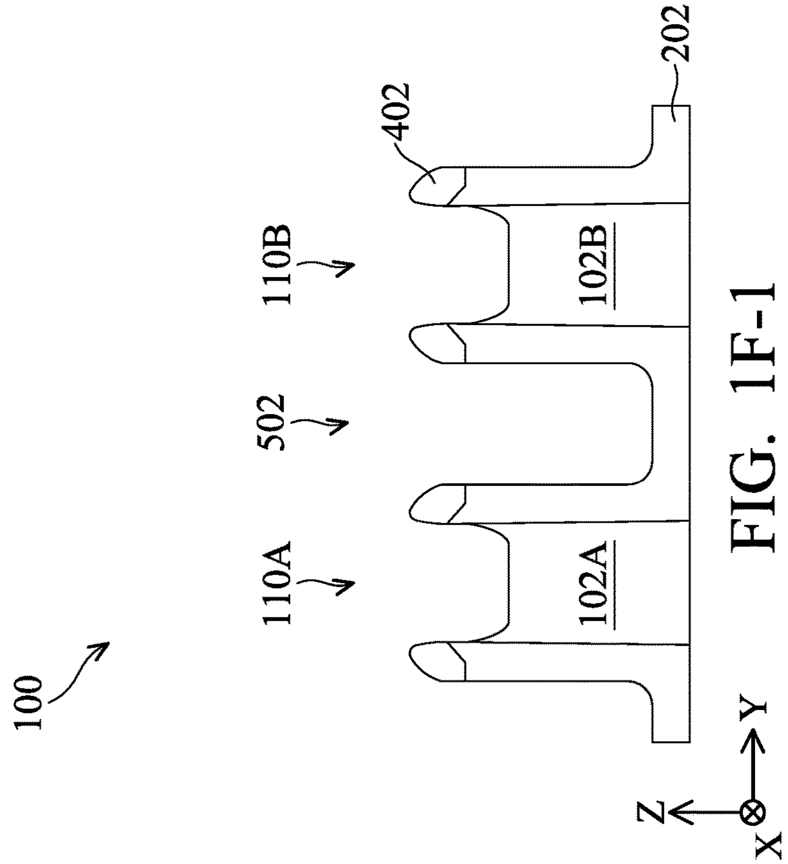
Figures 1, 1G, 2:
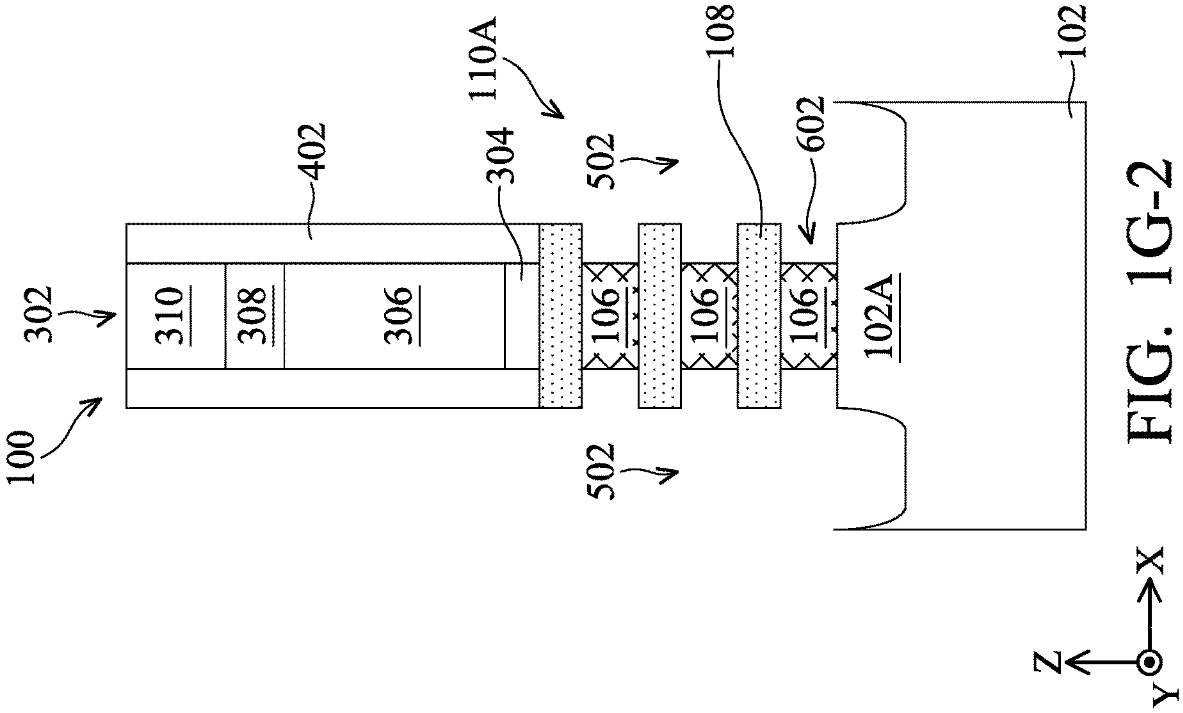
Figures 1, 1G:
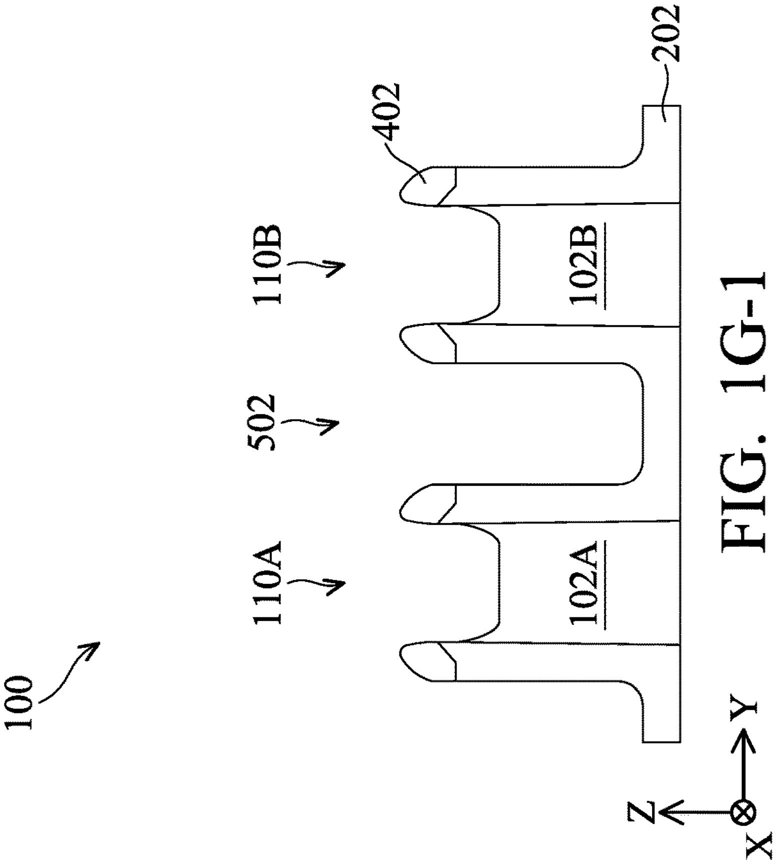
Figures 1, 1H, 2:
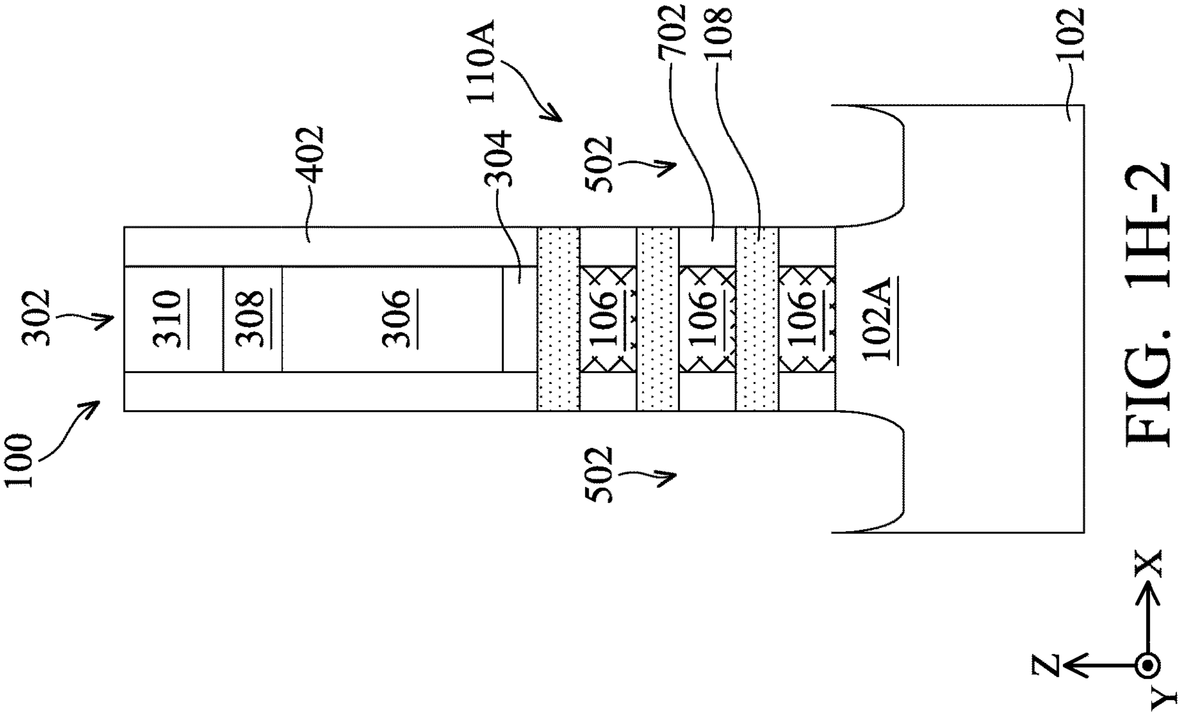
Figures 1, 1H:
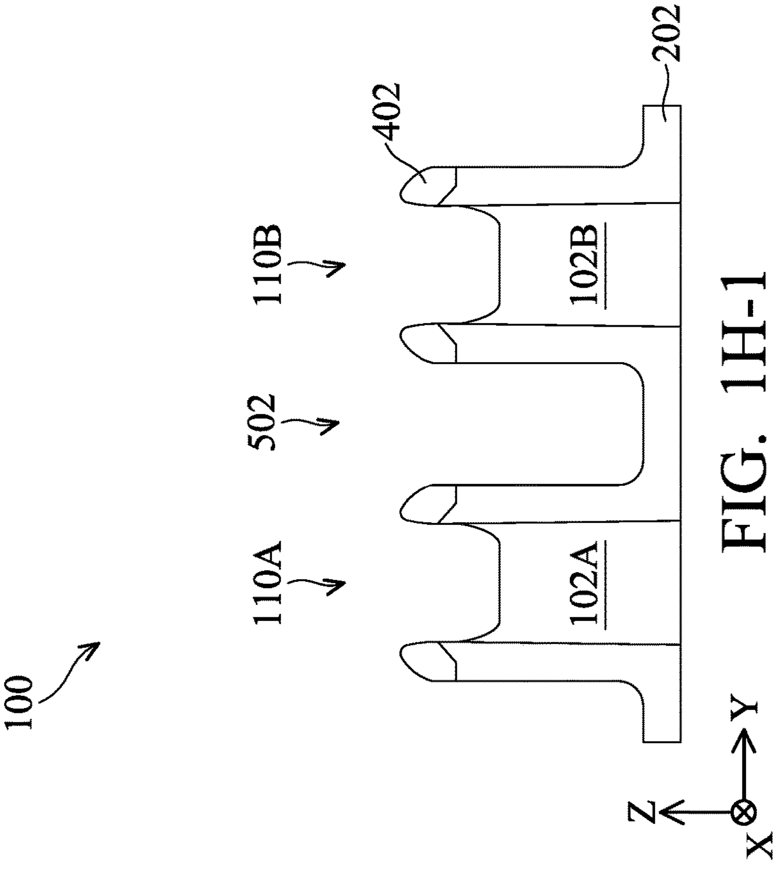
Figures 1, 1I, 2:
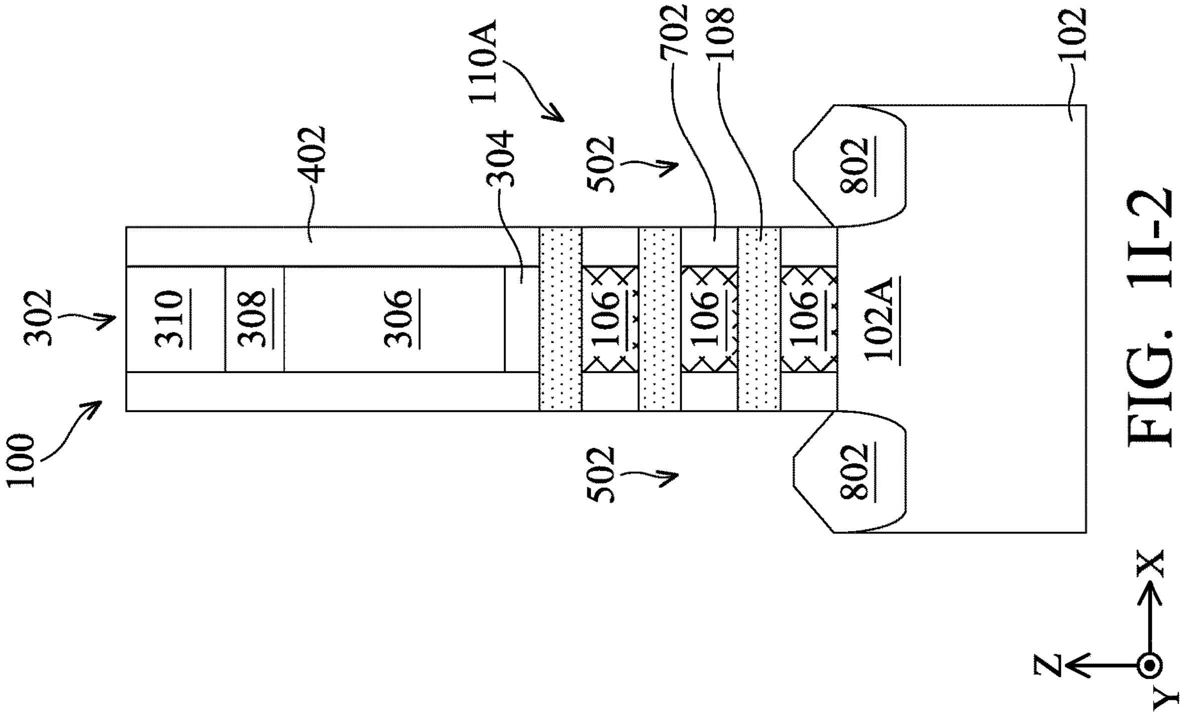
Figures 1, 1I:
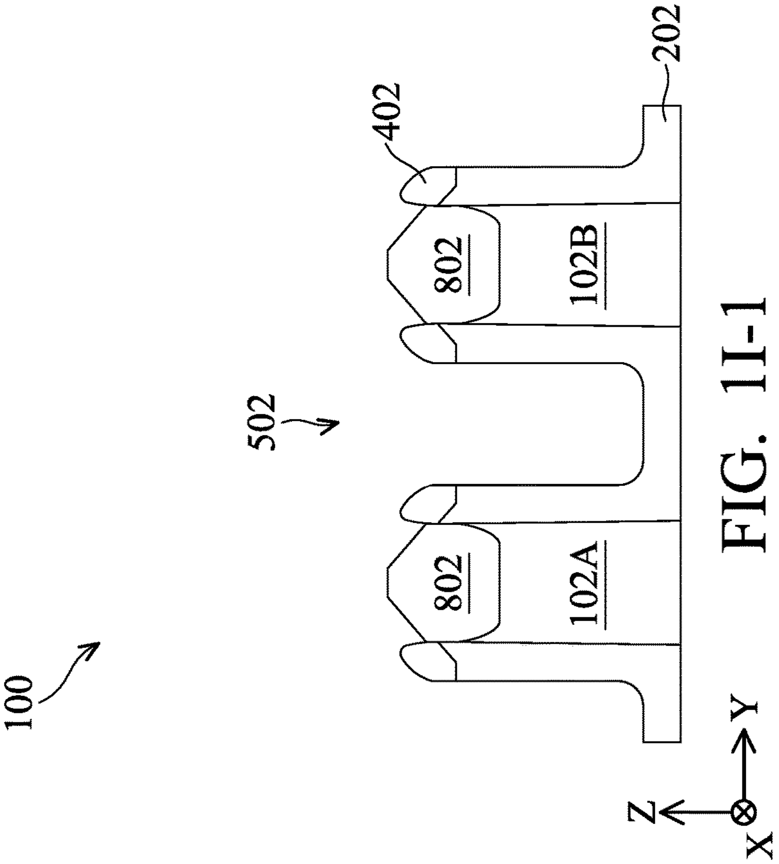
Figures 1, 1J, 2:
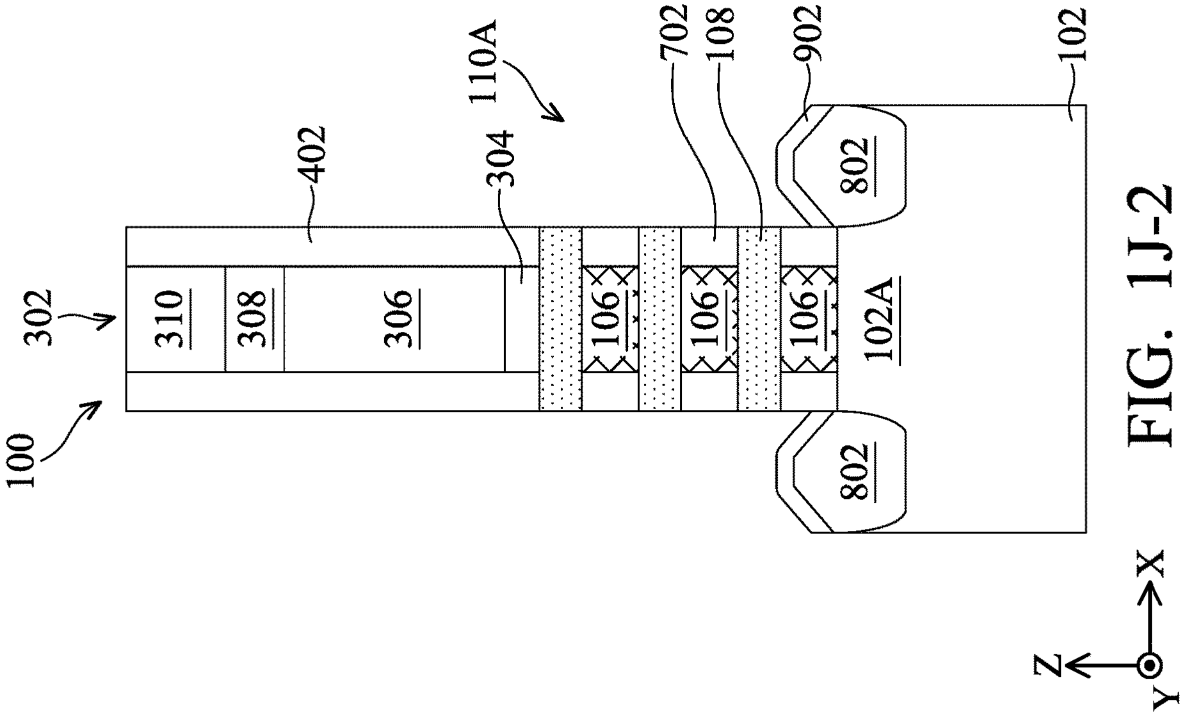
Figures 1, 1J:
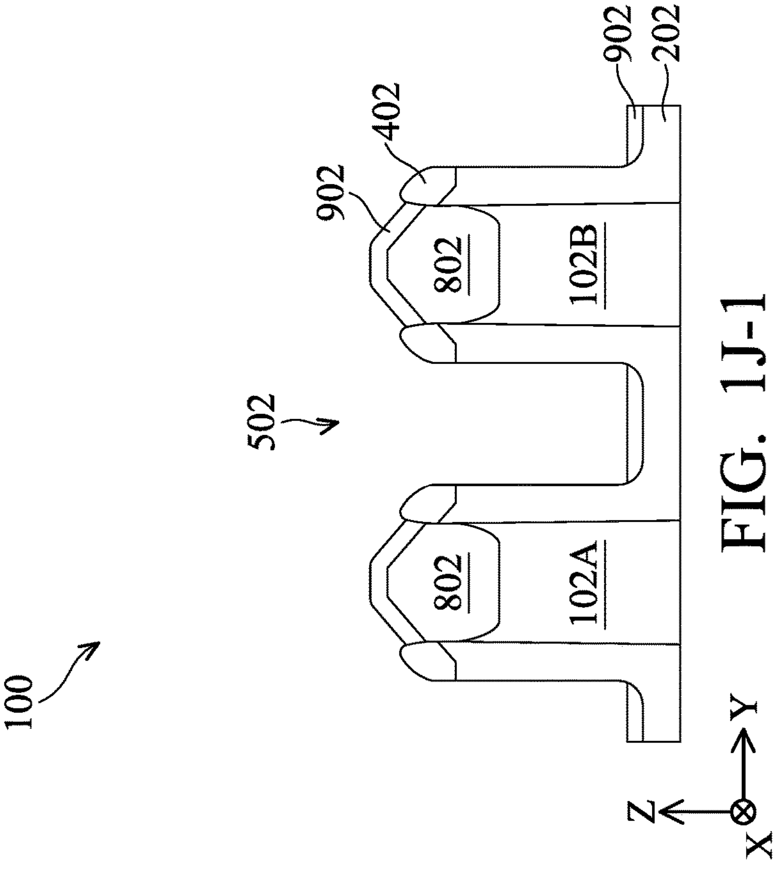
Figures 1, 1K, 2:
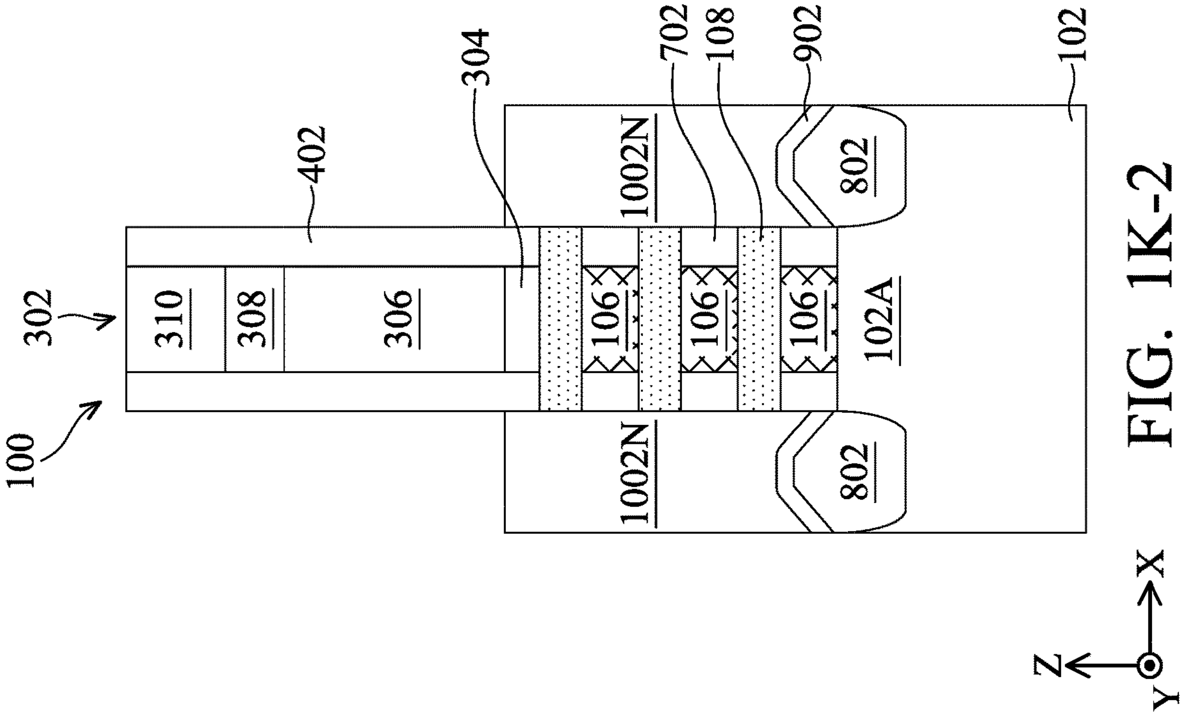
Figures 1, 1K:
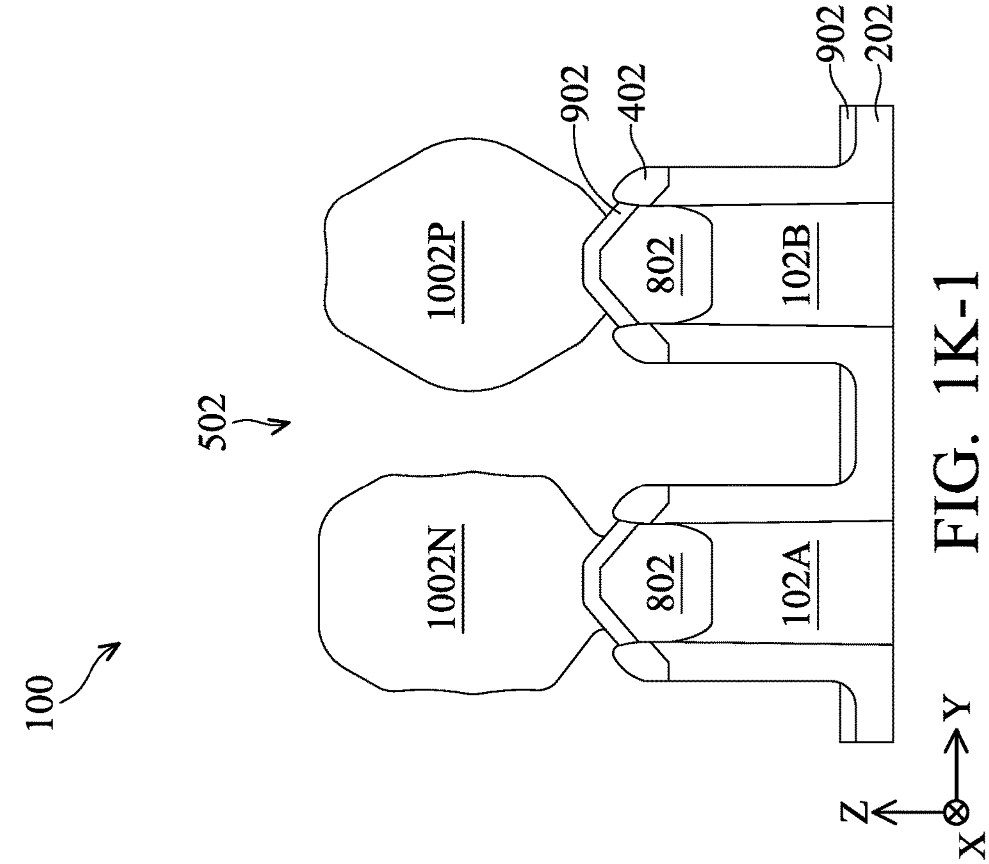
Figures 1, 1L, 2:
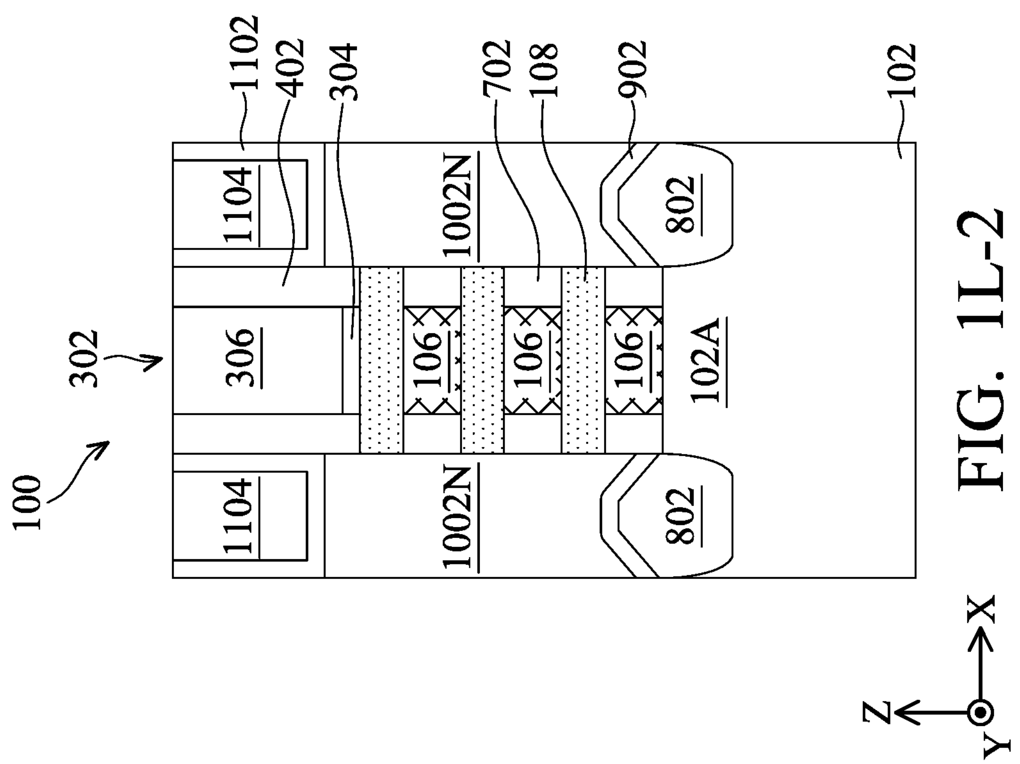
Figures 1, 1L:
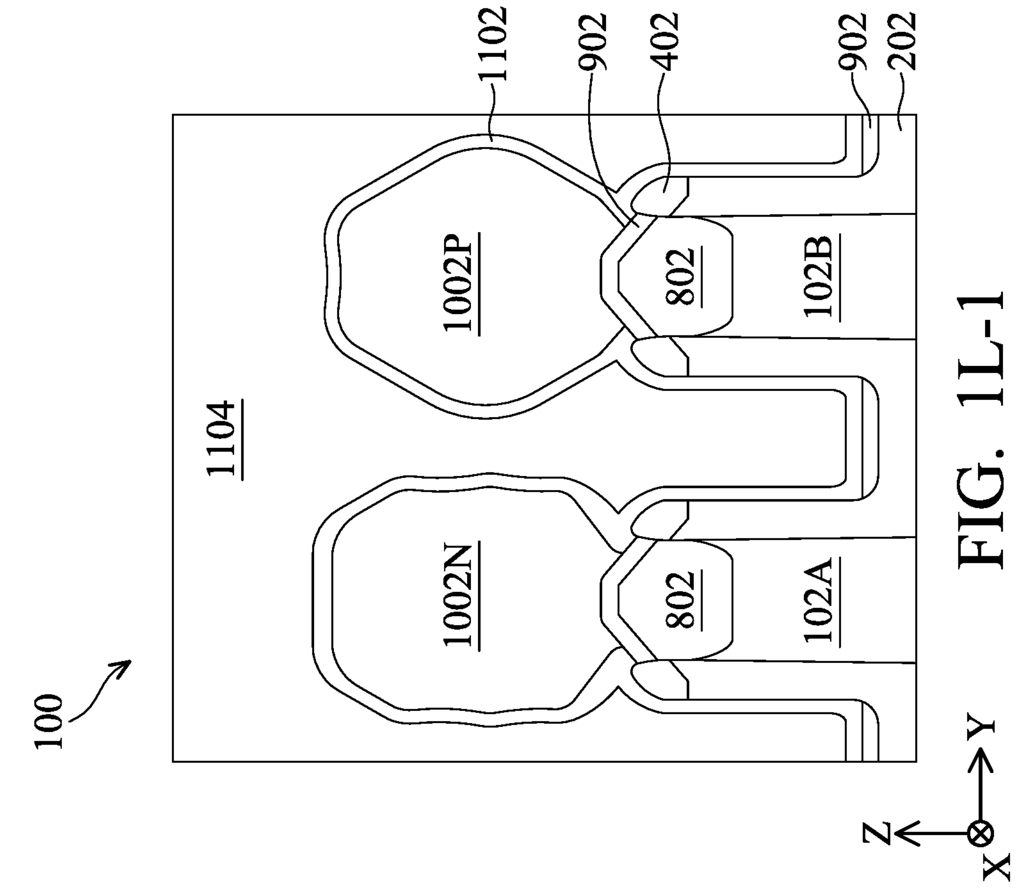
Figures 1, 1M, 2:
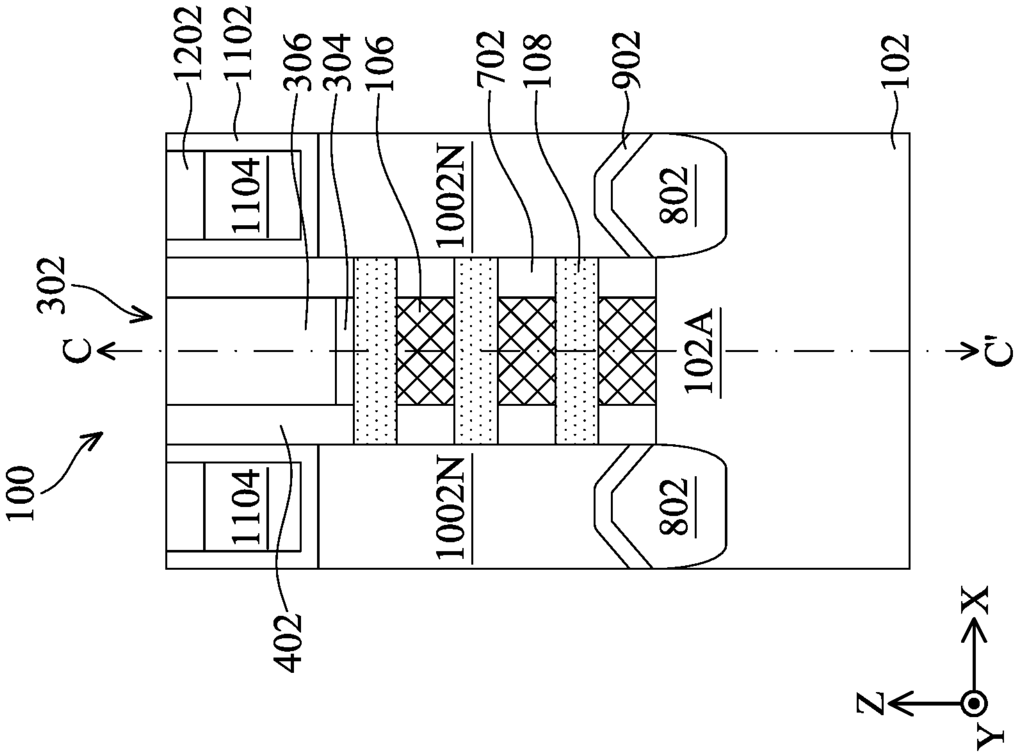
Figures 1, 1M:
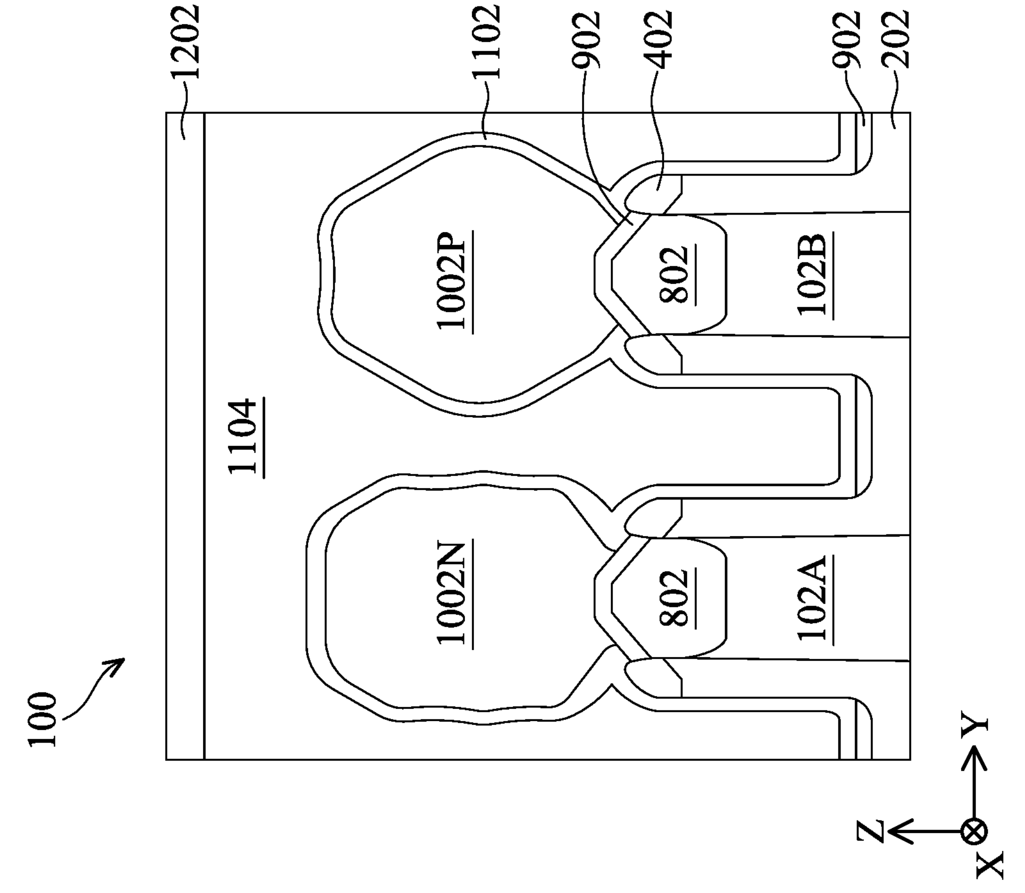

FIGS. 1E-1 to 1M-1 are Y-Z cross-sectional views of the workpiece 100 at various fabrication stages along a line A-A' of FIG. 1D, in accordance with some embodiments of the present disclosure. FIGS. 1E-2 to 1M-2 are X-Z cross-sectional views of the workpiece 100 at various fabrication stages along a line B-B' of FIG. 1D, in accordance with some embodiments of the present disclosure. Referring to FIGS. 1E-1 and 1E-2, gate spacers 402 are formed on sidewalls of the dummy gate structure 302, over the top surface of the fins 110, and the sidewalls of the fins 110. More specifically, the gate spacers 402 are formed on opposite the sidewalls of the fins 110, as shown in FIG. 1E-1, and formed on opposite the sidewalls of the dummy gate structure 302, as shown in FIG. 1E-2. The gate spacers 402 may include silicon nitride ($Si_3N_4$), silicon oxide (SiO), silicon carbide (SiC), silicon oxycarbide (SiOC), silicon oxynitride (SiON), silicon carbon nitride (SiCN), silicon oxycarbon nitride (SiOCN), carbon doped oxide, nitrogen doped oxide, porous oxide, or combinations thereof. The gate spacers 402 may include a single layer or a multi-layer structure. In some embodiments, the gate spacers 402 may be formed by conformally depositing a spacer layer (containing the dielectric material) over the isolation structure 202, the fins 110, and dummy gate structure 302, followed by an anisotropic etching process to remove top portions of the spacer layer from the top surfaces of the isolation structure 202, the fins 110, and dummy gate structure 302. After the etching process, portions of the spacer layer on the sidewall surfaces of the fins 110 and the dummy gate structure 302 substantially remain and become the gate spacers 402. In some embodiments, the anisotropic etching process is a dry (e.g., plasma) etching process. Additionally or alternatively, the formation of the gate spacers 402 may also involve chemical oxidation, thermal oxidation, ALD, CVD, and/or other suitable methods. The gate spacers 402 may also be interchangeably referred to as the top spacers.

Referring to FIG. 1F, the fins 110 is recessed to form source/drain trenches 502 in the fins 110 (or passing through the semiconductor layers 106 and 108) for source/drain regions. Specifically, the source/drain trenches 502 may be formed by performing one or more etching processes to remove portions of the semiconductor layers 106, the semiconductor layers 108, the substrate 102 (base fins 102A and 102B), and the isolation structure 202 that do not vertically overlap or be covered by the dummy gate structure 302 and the gate spacers 402 on opposite the sidewalls of the gate structure 302. In some embodiments, a single etchant may be used to remove the semiconductor layers 106, the semiconductor layers 108, and the substrate 102, whereas in other embodiments, multiple etchants may be used to perform the etching process. After the recessing, sidewalls of the semiconductor layers 106 and 108 that vertically overlap or be covered by the dummy gate structure 302 and the gate spacers 402 are exposed, as shown in FIG. 1F-2. Furthermore, the isolation structure 202 that do not vertically overlap or be covered by the dummy gate structure 302 and the gate spacers 402 may be removed and etched, as shown in FIG. 1F-1, such that top surfaces of the isolation structure 202 in the source/drain region are lower than top surfaces of the isolation structure in a channel region where nanostructures formed from the semiconductor layers 108 located (as shown in FIG. 1W-4). In some embodiments, top portions of the gate spacers on the sidewalls of the fins 110 are also removed, as shown in FIG. 1F-1. In other embodiments, although not shown in FIG. 1F-2, top portions of the hard mask layer 310 and the gate spacers on the sidewalls of the dummy gate structure 302 are removed, such that heights of the dummy gate structure 302 (the hard mask layer 310) and the gate spacers are reduced.

Referring to FIGS. 1G-1 and 1G-2, side portions of the semiconductor layers 106 are removed via a selective etching process. Specifically, the selective etching process is performed that selectively etches the side portions of the semiconductor layers 106 below the gate spacers 402 through the source/drain trenches 502, with minimal (or no) etching of semiconductor layers 108, such that gaps 602 are formed between the semiconductor layers 108 as well as between the semiconductor layers 108 and the substrate 102, below the gate spacers 402. The etching process is configured to laterally etch (e.g., along the X-direction) the semiconductor layers 106 below the gate spacers 710. The selective etching process is a dry etching process, a wet etching process, other suitable etching process, or combinations thereof.

Referring to FIGS. 1H-1 and 1H-2, inner spacers 702 are formed to fill the gaps 602. In some embodiments, sidewalls of the inner spacers 702 are aligned to the sidewalls of the gate spacers 402 and the semiconductor layers 108, as shown in FIG. 1H-2. In order to form the inner spacers 702, a deposition process forms a spacer layer into the source/drain trenches 502 and the gaps 602, such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 502. The deposition process is configured to ensure that the spacer layer fills the gaps 602 between the semiconductor layers 108 as well as between the semiconductor layer 108 and the substrate 102 under the gate spacers 402. An etching process is then performed that selectively etches the spacer layer to form inner spacers 702 (as shown in FIG. 1H-2) with minimal (to no) etching of the semiconductor layer 108, the substrate 102, the dummy gate structure 302, and the gate spacers 402. The spacer layer (and thus inner spacers 702) includes a material that is different than a material of the semiconductor layers 108 and a material of the gate spacers 402 to achieve desired etching selectivity during the etching process. In some embodiments, the inner spacers 702 include a dielectric material that includes silicon, oxygen, carbon, nitrogen, other suitable material, or combinations thereof (for example, silicon oxide ($SiO_2$), silicon oxynitride (SiON), silicon oxycarbide (SiOC), silicon oxycarbon nitride (SiOCN)). In some embodiments, the inner spacers 702 include a low-k dielectric material, such as those described herein.

Referring to FIGS. 1I-1 to 1I-2, silicon features 802 are formed over the substrate 102 in the source/drain trenches 502. More specifically, the silicon features 802 are formed over the base fins 102A and 102B (formed from the substrate 102) exposed in the source/drain trenches 502. Furthermore, the silicon features 802 are in contact with and between the gate spacers 402 and between the isolation structure 202, in a Y-Z cross-sectional view, as shown in FIG. 1I-1. In some embodiment, the silicon features 802 are in contact with sidewalls of the inner spacers 702, in an X-Z cross-sectional view, as shown in FIG. 1I-2. In some embodiments, top surfaces of the silicon features 802 are lower than bottommost surfaces of the semiconductors 108. In some embodiment, the silicon features 802 each has a convex surface. The silicon features 802 are made of silicon without dopants. In other word, the silicon features 802 are un-doped silicon, and thus may be referred to as un-doped silicon features. One or more epitaxy processes may be performed to form the silicon features 802. Epitaxy processes may implement CVD deposition techniques (for example, vapor-phase epitaxy (VPE), UHVCVD, LPCVD, and/or PECVD), molecular beam epitaxy, other suitable SEG processes, or combinations thereof.

Referring to FIGS. 1J-1 to 1J-2, dielectric layers 902 are formed over the silicon features 802 and the isolation structure 202 in the source/drain trenches 502. In some embodiments, dielectric layers 902 are in contact with and between the gate spacers 402, in the Y-Z cross-sectional view, as shown in FIG. 1I-1. In some embodiment, dielectric layers 902 are in contact with sidewalls of the inner spacers 702, in the X-Z cross-sectional view, as shown in FIG. 1I-2. In order to form the dielectric layers 902, a dielectric material is conformally formed over isolation structure 202, silicon features 802, and the dummy gate structure 302, and on sidewalls of the isolation structure 202, the gate spacers 402, the inner spacers 702, and the semiconductor layers 108 by a deposition process, such as CVD, PVD, ALD, HDPCVD, MOCVD, RPCVD, PECVD, LPCVD, ALCVD, APCVD, other suitable methods, or combinations thereof. An etching process is then performed that etches portions of the dielectric material on the sidewalls of the isolation structure 202, the gate spacers 402, the inner spacers 702, and the semiconductor layers 108 to form the dielectric layers 902 over the silicon features 802 and the isolation structure 202, as shown in FIGS. 1J-1 and 1J-2. In some embodiments, the dielectric material may include $Si_3N_4$, SiCN, SiOCN, other suitable material(s), or combinations thereof Referring to FIGS. 1K-1 and 1K-2, source/drain features 1002N and 1002P are formed in the source/drain trenches 502. Specifically, the source/drain features 1002N and 1002P are formed over the silicon features 802 and the dielectric layers 902. The source/drain features are also formed on opposite sides of the dummy gate structures 302 in the X-direction. For example, the source/drain features 1002N are formed on opposite sides of the dummy gate structure 302, as shown in FIG. 1K-2. The source/drain features 1002N and 1002P are connected to and in contact with the semiconductor layers 108. In some aspects, the semiconductor layers 108 serve as channels to connect one source/drain feature 1002N/1002P to another source/drain feature 1002N/1002P. Therefore, the semiconductor layers 108 may also be referred to as channels, channel layers, or channel members. As shown in FIG. 1K-2, in the Y-Z cross-sectional view, the source/drain features 1002N has a hexagon-like shape and the source/drain features 1002P has an octagon-like shape. In some embodiments, the source/drain features 1002N and 1002P may have top surfaces that extend higher than top surfaces of the topmost semiconductor layers 108 (e.g., in the Z-direction), as shown in FIG. 1K-2. In other embodiments, the top surfaces of the source/drain features 1002N and 1002P are substantially level with the top surfaces of the topmost semiconductor layers 108 (i.e., substantially coplanar). It should be noted that the source/drain features 1002N and 1002P are separated from the substrate 102 (more specifically, the base fins 102A and 102B) by the silicon features 802 and the dielectric layers 902. As such, it prevents the leakage current of the resultant transistors from one source/drain feature 1002N/1002P to another source/drain feature 1002N/1002P through the substrate 102 (more specifically, the base fins 102A and 102B), thereby improving performances of the resultant transistors.

One or more epitaxy processes may be employed to grow the source/drain features 1002N and 1002P. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 1002N and 1002P are grown from the semiconductor layers 108 rather than the substrate 102 due to the silicon features 802 and the dielectric layers 902 cover the top surfaces of the substrate 102.

The source/drain features 1002N and 1002P may include any suitable semiconductor materials. For example, the source/drain features 1002N for n-type GAA transistors may include silicon (Si), silicon carbide (SiC), silicon phosphide (SiP), silicon arsenide (SiAs), silicon phosphoric carbide (SiPC), or combinations thereof; while the source/drain features 1002P for p-type GAA transistors may include silicon (Si), silicon germanium (SiGe), germanium (Ge), silicon germanium carbide (SiGeC), or combinations thereof. The source/drain features 1002N and 1002P may be doped in-situ or ex-situ. For example, the epitaxially grown Si source/drain features may be doped with carbon to form silicon: carbon (Si: C) source/drain features, phosphorous to form silicon: phosphor (Si: P) source/drain features, or both carbon and phosphorous to form silicon carbon phosphor (SiCP) source/drain features; and the epitaxially grown SiGe source/drain features may be doped with boron. The source/drain features 1002N and 1002P may also be referred to as source/drain, or source/drain regions. In some embodiments, source/drain feature(s) 1002N/1002P may refer to a source or a drain, individually or collectively dependent upon the context. In some embodiments, the source/drain features 1002N may be referred to as n-type source/drain features and the source/drain features 1002P may be referred to as p-type source/drain features. One or more annealing processes may be performed to activate the dopants in the source/drain features 1002N and 1002P. The annealing processes may include rapid thermal annealing (RTA) and/or laser annealing processes.

Referring to FIGS. 1L-1 and 1L-2, a contact etch stop layer (CESL) 1102 over the source/drain features 1002N and 1002P and an interlayer dielectric (ILD) layer 1104 over the CESL 1102 are formed to fill the space between the gate spacers 402 and in the source/drain trenches 502. Specifically, the CESL 1102 is conformally formed on the sidewalls of the gate spacers 402, the isolation structure 202, the source/drain features 1002N and 1002P, over the top surfaces of the source/drain features 1002N and 1002P and the dielectric layers 902 (over isolation structure 202), as shown in FIGS. 1L-1 and 1L-2. Furthermore, the CESL 1102 is in contact with the dielectric layers 902 directly under the source/drain features 1002N and 1002P, as shown in FIG. 1L-1.

The ILD layer 1104 is formed over and between the CESL 1102 to fill a remaining space between the CESL 1102, between the gate spacers 402 and in the source/drain trenches 502. The CESL 1102 includes a material that is different than ILD layer 1104. The CESL 1102 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 1104 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 1104 may be formed by PECVD (plasma enhanced CVD), FCVD (flowable CVD), or other suitable methods.

Subsequent to the deposition of the CESL 1102 and the ILD layer 1104, a CMP process and/or other planarization process is performed on the CESL 1102, the ILD layer 1104, the gate spacers 402, and the hard mask layers 308 and 310 until the top surfaces of the dummy gate electrode 306 is exposed. In some embodiments, the ILD layer 1104 is recessed to a level below the top surface of the dummy gate electrode 306 and an ILD protection layer 1202 is formed over the ILD layer 1104 to protect the ILD layer 1104 from subsequent etching processes. As shown in FIGS. 1M-1 and 1M-2, the ILD layer 1104 is surrounded by the CESL 1102 and the ILD protection layer 1202. In some embodiments, the ILD protection layer 1202 includes a material that is the same as or similar to that in the CESL 1202. In some other embodiments, the ILD protection layer 1202 includes a dielectric material such as $Si_3N_4$, SiCN, SiOCN, SiOC, a metal oxide such as $HrO_2$, $ZrO_2$, hafnium aluminum oxide, hafnium silicate, or other suitable material, and may be formed by CVD, PVD, ALD, or other suitable methods.

Figure 1N:
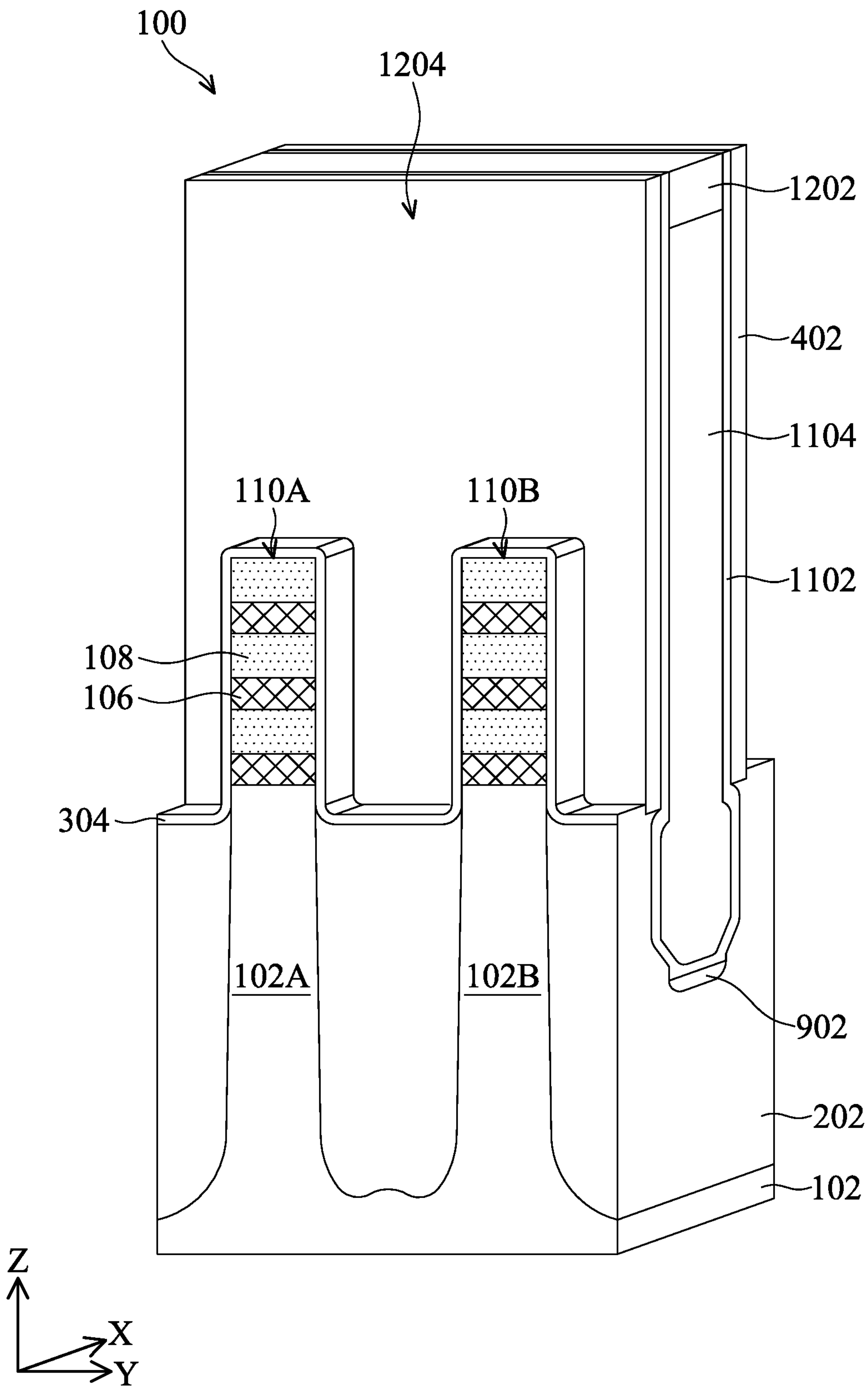
FIGS. 1N, 1O, 1P, 1Q, 1R, 1S, 1T, 1U, and 1V are perspective views of the workpiece 100 at various fabrication stages along a line C-C' of FIG. 1M-2, in accordance with some embodiments of the present disclosure.

FIGS. 1N to 1V are perspective views of the workpiece 100 at various fabrication stages along a line C-C' of FIG. 1M-2, in accordance with some embodiments of the present disclosure. Referring to FIG. 1N, the dummy gate electrode 306 of the dummy gate structure 302 are selectively removed through any suitable lithography and etching processes to form a gate trench 1204. In some embodiments, the lithography process may include forming a photoresist layer (resist), exposing the resist to a pattern, performing a post-exposure bake process, and developing the resist to form a masking element, which exposes a region including the dummy gate electrode 306. Then, the dummy gate electrode 306 is selectively etched through the masking element. The gate spacers 402 may be used as the masking element or a part thereof. Etch selectivity may be achieved by selecting the appropriate etching chemicals, and the dummy gate electrode 306 may be removed without substantially affecting the dummy interfacial layer 304, ILD protection layer 1202, the CESLs 1302, and the ILD layer 1304. The removal of the dummy gate structures 302 creates the gate trench 1204, in which the gate trench 1402 exposes the dummy interfacial layer 304 conformally formed on the sidewalls of the fins 110 and over the top surfaces of the fins 110 and the isolation structure 202, as shown in FIG. 1N.

Figure 1O:
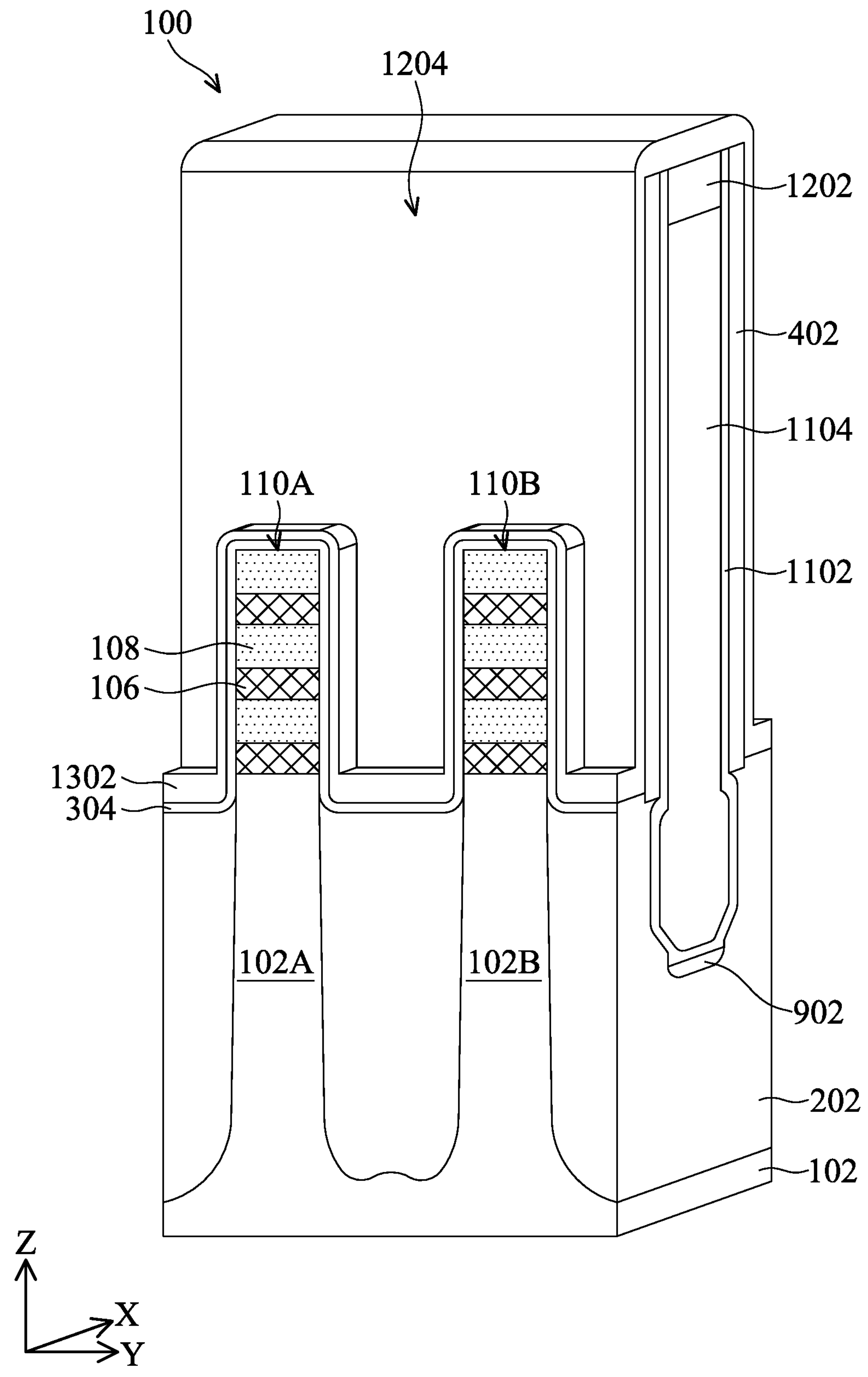

Referring to FIG. 1O, a hard mask material 1302 is conformally formed over and covers the dummy interfacial layer 304, the gate spacers 402, the CESL 1102, the ILD protection layer 1202, and on sidewalls of the gate spacers 402 and the fins 110 (more specifically, the dummy interfacial layer 304). In some embodiments, the hard mask material 1302 is deposited by a physical vapor deposition (PVD) process. As such, a thickness of the hard mask material 1302 on top surfaces of the dummy interfacial layer 304, the gate spacers 402, the CESL 1102, and the ILD protection layer 1202 is greater than a thickness of the hard mask material 1302 on the sidewalls of the gate spacers 402 and the dummy interfacial layer 304, as shown in FIG. 1N. In some embodiments, the hard mask material 1302 may be a dielectric material, such as $Al_2O_3$, SiN, SiCN, SiOCN, SiOC, SiON, or combinations thereof. In other embodiments, the hard mask material 1302 may include work function materials, such as n-type work function materials (including Ti, Al, Ag, Mn, Zr, TiAl, TiAlC, TaC, TaCN, TaSiN, TaAl, TaAlC, TiAlN, other n-type work function material, or combinations thereof) and/or p-type work function materials (including TiN, TaN, Ru, Mo, Al, WN, ZrSi2, MoSi2, TaSi2, NiSi2, WN, other p-type work function material, or combinations thereof).

Figure 1P:
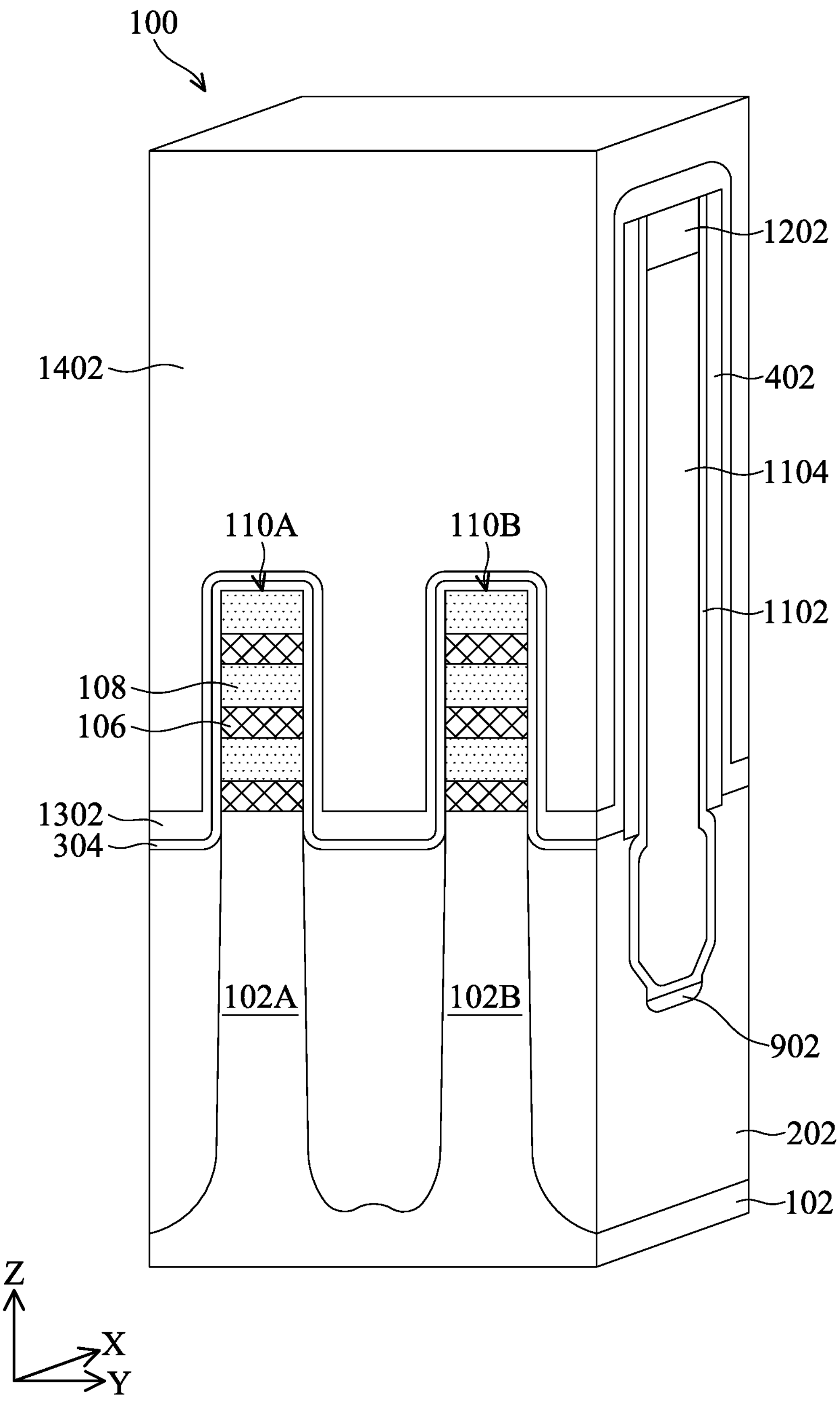

Referring to FIG. 1P, a bottom anti-reflective coating (BARC) layer 1402 is formed over the hard mask material 1302 and between the fins 110. Specifically, the BARC layer 1402 is formed in the gate trench 1204 to cover the hard mask material 1302. In some embodiments, the BARC layer 1402 may include or be photoresist having photosensitive material. In other embodiments, the BARC layer 1402 may include materials that are selective to the hard mask material 1302. In various embodiments, the BARC layer 1402 may be formed by CVD, subatmospheric CVD (SACVD), flowable CVD (FCVD), ALD, spin-on coating, and/or other suitable process, or a combination thereof.

Figure 1Q:
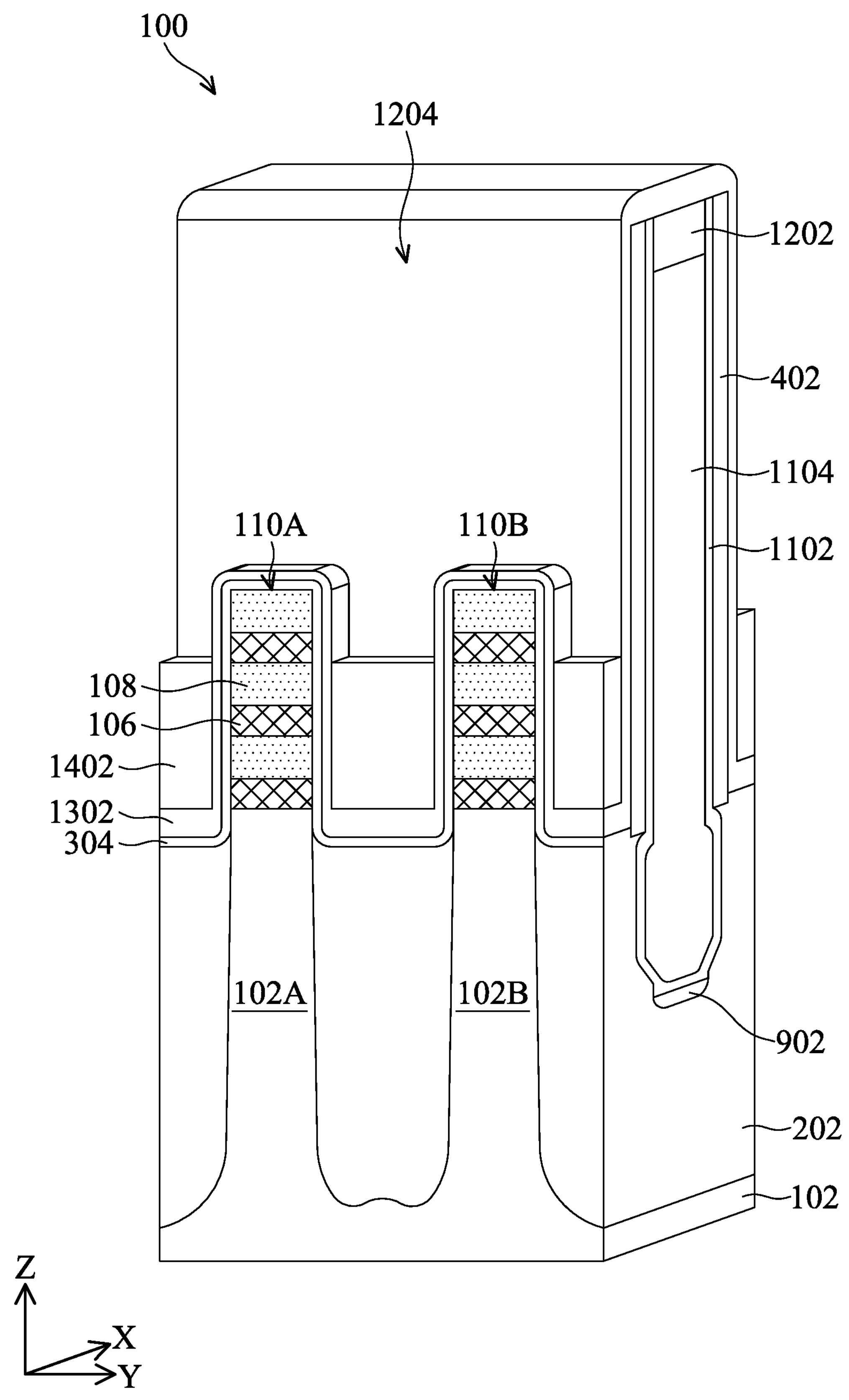

Referring to FIG. 1Q, the BARC layer 1402 is partially removed through any suitable lithography and etching processes. More specifically, the BARC layer 1402 is recessed by a selective etching process with minimal (to no) etching of the hard mask material 1302. The selective etching process is a dry etching process, a wet etching process, other suitable etching process, or combinations thereof. In some embodiments, the BARC layer 1402 is recessed to a level about below top surfaces of the fins 110. The remaining (or recessed) BARC layer 1402 in the gate trench 1204 is over the hard mask material 1302 between the fins 110. As shown in FIG. 1Q, after the partially recessing and removing of the BARC layer 1402, portions of the hard mask material 1302 on top portions of the sidewalls of the fins 110 (more specifically, the dummy interfacial layer 304) and the gate spacers 402 are exposed in the gate trench 1204.

Figure 1R:
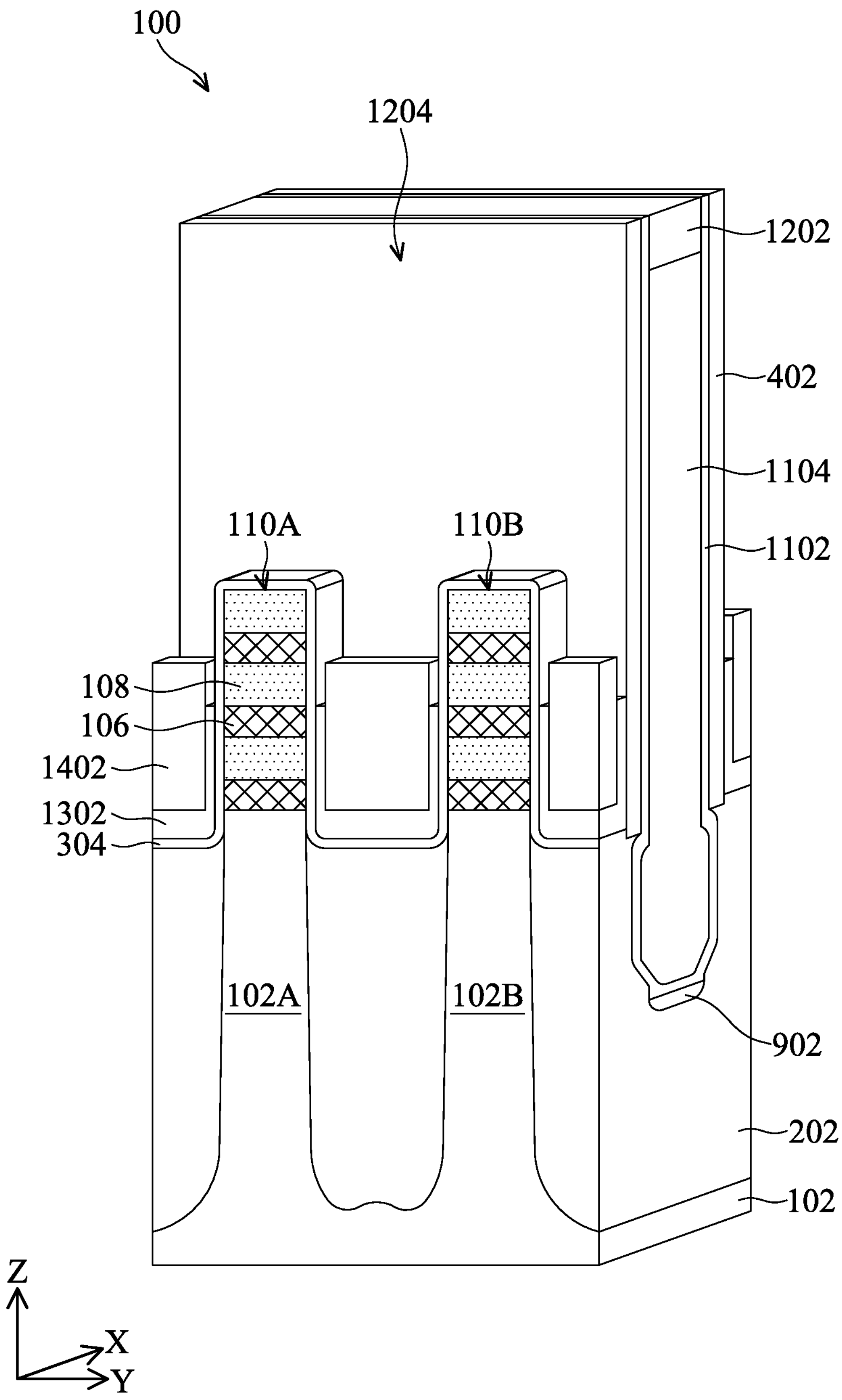

Referring to FIG. 1R, the hard mask material 1302 are partially removed and recessed. More specifically, portions of the hard mask material 1302 not covered by the BARC layer 1402 (the exposed portions of the hard mask material 1302 discussed above) are removed through any suitable selective etching process with minimal (to no) etching of the dummy interfacial layer 304, the gate spacers 402, the CESL 1102, the ILD protection layer 1202, and the BARC layer 1402. The selective etching process is a dry etching process, a wet etching process, other suitable etching process, or combinations thereof. In some embodiments, the hard mask material 1302 is recessed to a level about below the top surfaces of the fins 110 and the BARC layer 1402. In other words, top surfaces of the (remaining) hard mask material 1302 is below the top surfaces of the fins 110 and the BARC layer 1402, as shown in FIG. 1R.

Figure 1S:
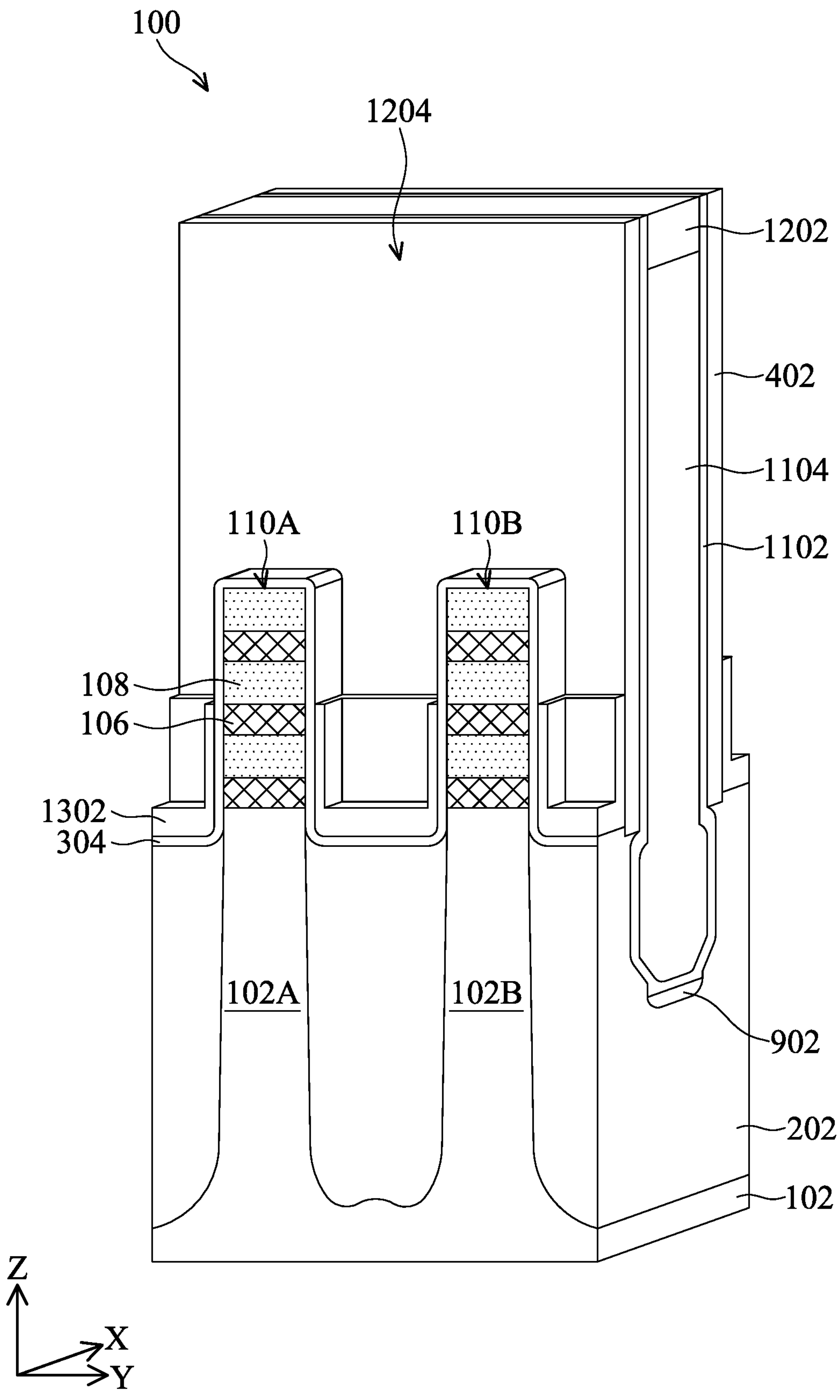

Referring to FIG. 1S, the BARC layer 1402 in the gate trench 1204 is fully removed through any suitable etching process. More specifically, the BARC layer 1402 in the gate trench 1204 is removed by a selective etching process with minimal (to no) etching of the dummy interfacial layer 304, the gate spacers 402, the CESL 1102, the ILD protection layer 1202, and the hard mask material 1302. The selective etching process is a dry etching process, a wet etching process, other suitable etching process, or combinations thereof. As shown in FIG. 1Q, after the removing of the BARC layer 1402, portions of the hard mask material 1302 on bottom portions of the sidewalls of the fins 110 (more specifically, the dummy interfacial layer 304) and the gate spacers 402 and over the isolation structure 202 and the dummy interfacial layer 304 are exposed in the gate trench 1204.

Figure 1T:
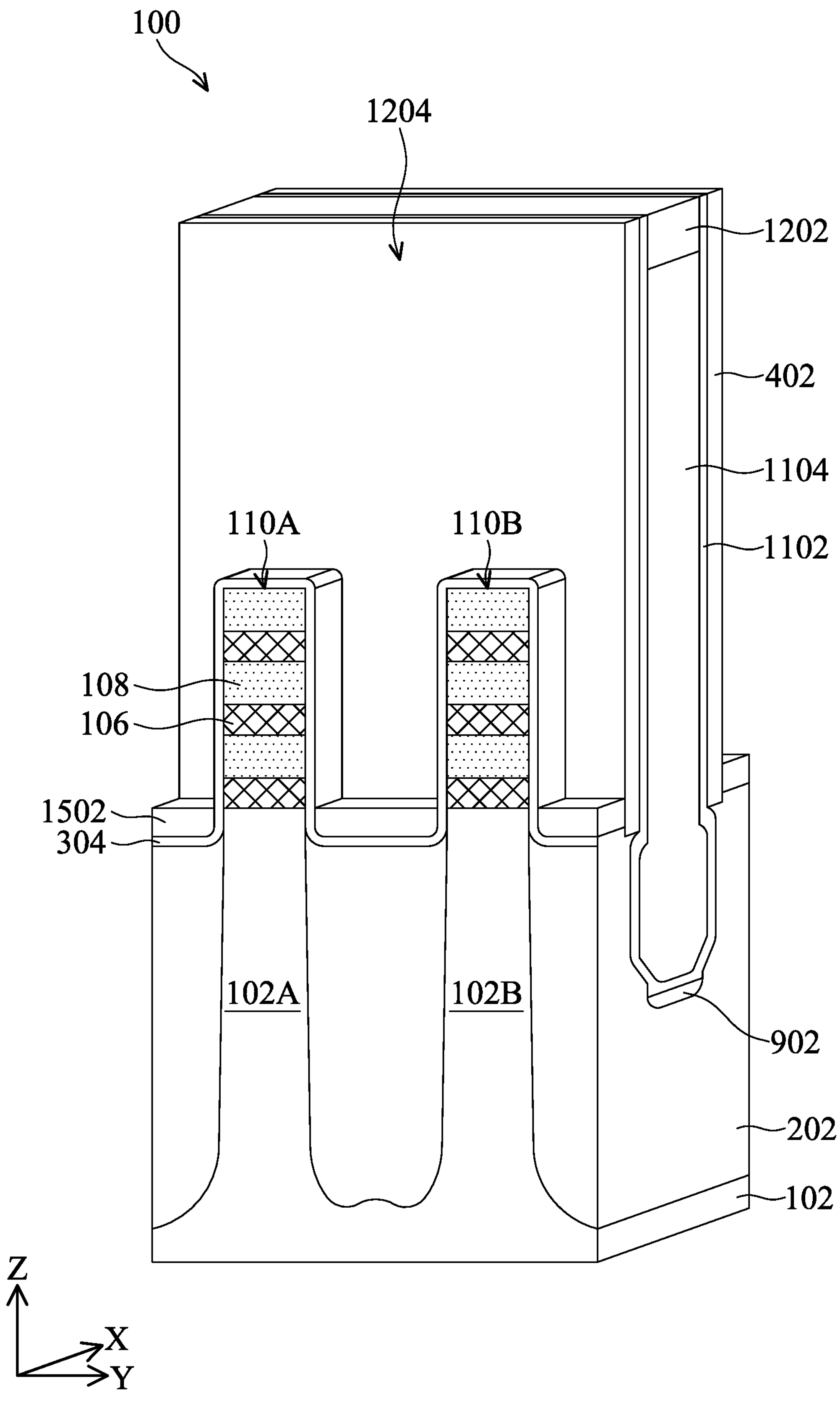

Referring to FIG. 1T, the hard mask material 1302 are partially removed to form hard mask layers 1502. More specifically, portions of the hard mask material 1302 on bottom portions of the sidewalls of the fins 110 (more specifically, the dummy interfacial layer 304) and the gate spacers 402 are removed through any suitable selective etching process with minimal (to no) etching of the dummy interfacial layer 304, the gate spacers 402, the CESL 1102, and the ILD protection layer 1202. The selective etching process is a dry etching process, a wet etching process, other suitable etching process, or combinations thereof. After the removing, the hard mask layers 1502 are formed over the isolation structure 202 and the dummy interfacial layer 304, between the fins 110 (in the Y-direction), and between the gate spacers 402 (in the X-direction). In some embodiments, top surfaces of the hard mask layers 1502 are substantially level with top surfaces of the base fins 102A and 102B (or bottommost surfaces of the semiconductor layers 106). In other embodiments, the top surfaces of the hard mask layers 1502 may be higher or lower than top surfaces of the base fins 102A and 102B (or bottommost surfaces of the semiconductor layers 106). In other embodiments, a thickness of the hard mask layers 1502 is in a range from about 1 nm to about 5 nm.

Figure 1U:
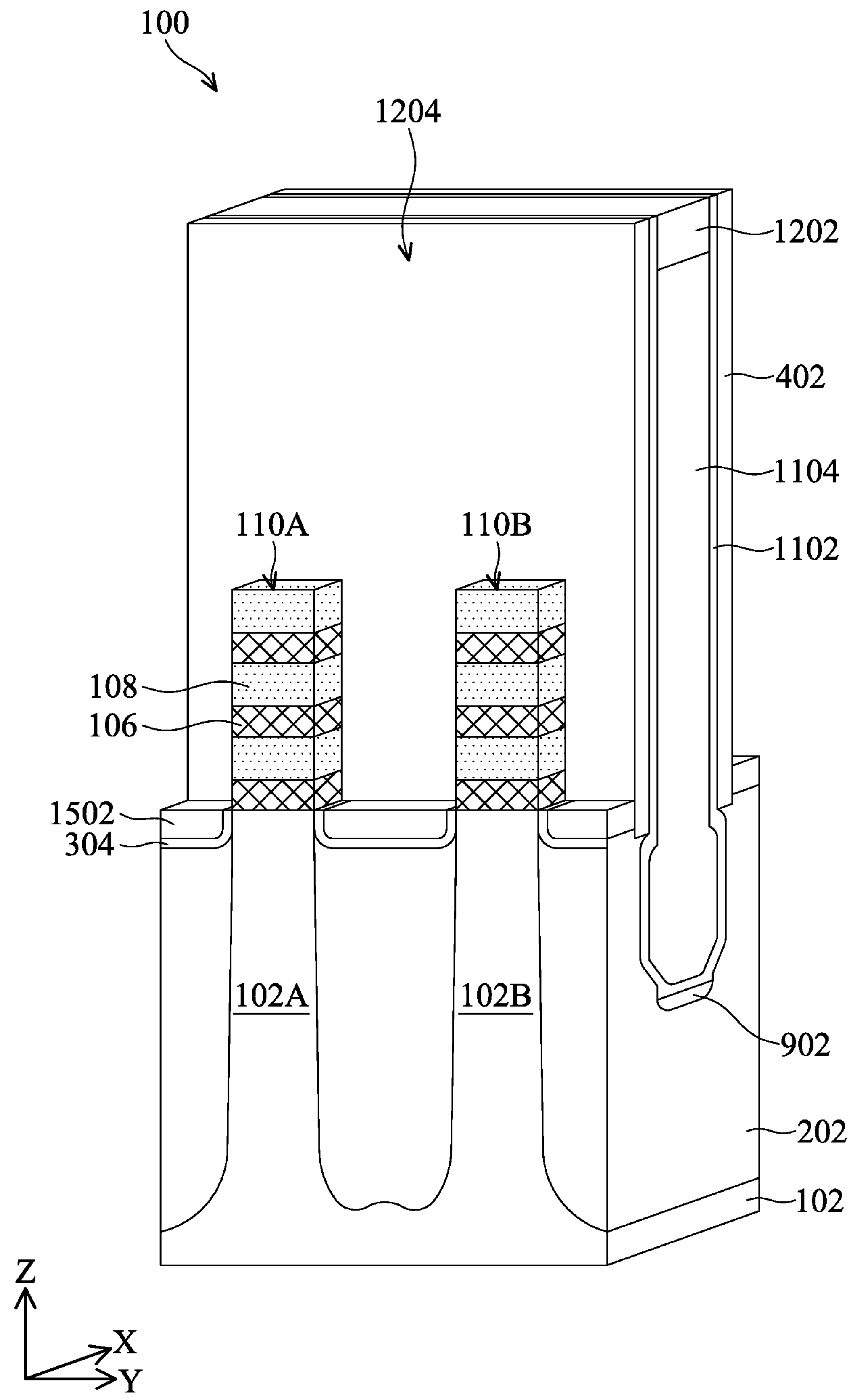

Referring to FIG. 1U, the dummy interfacial layer 304 is partially removed. More specifically, portions of the dummy interfacial layer 304 not covered by the hard mask layers 1502 (the dummy interfacial layer 304 on sidewalls of the fins 110 (more specifically, the semiconductor layers 106 and 108) and over the fins 110) are removed through any suitable selective etching process with minimal (to no) etching of the gate spacers 402, the CESL 1102, the ILD protection layer 1202, and the hard mask layers 1502. The selective etching process is a dry etching process, a wet etching process, other suitable etching process, or combinations thereof. After the removing, remaining portions of the dummy interfacial layer 304 are over the isolation structure 202, and then the hard mask layers 1502 cover the remaining portions of the dummy interfacial layer 304. Specifically, the (remaining) dummy interfacial layer 304 is vertically between the hard mask layers 1502 and the isolation structure 202, between the fins 110 (in the Y-direction), and between the gate spacers 402 (in the X-direction). In some embodiments, top surfaces of dummy interfacial layer 304 are substantially level with the top surfaces of the base fins 102A and 102B (or bottommost surfaces of the semiconductor layers 106) and the hard mask layers 1502. In some embodiments, the top surfaces of dummy interfacial layer 304 are lower than the top surfaces of the hard mask layers 1502. Furthermore, the hard mask layers 1502 is separated from the base fins 102A and 102B by the dummy interfacial layer 304. As shown in FIG. 1U, the dummy interfacial layer 304 is also on sidewalls of the hard mask layers 1502.

Figure 1V:
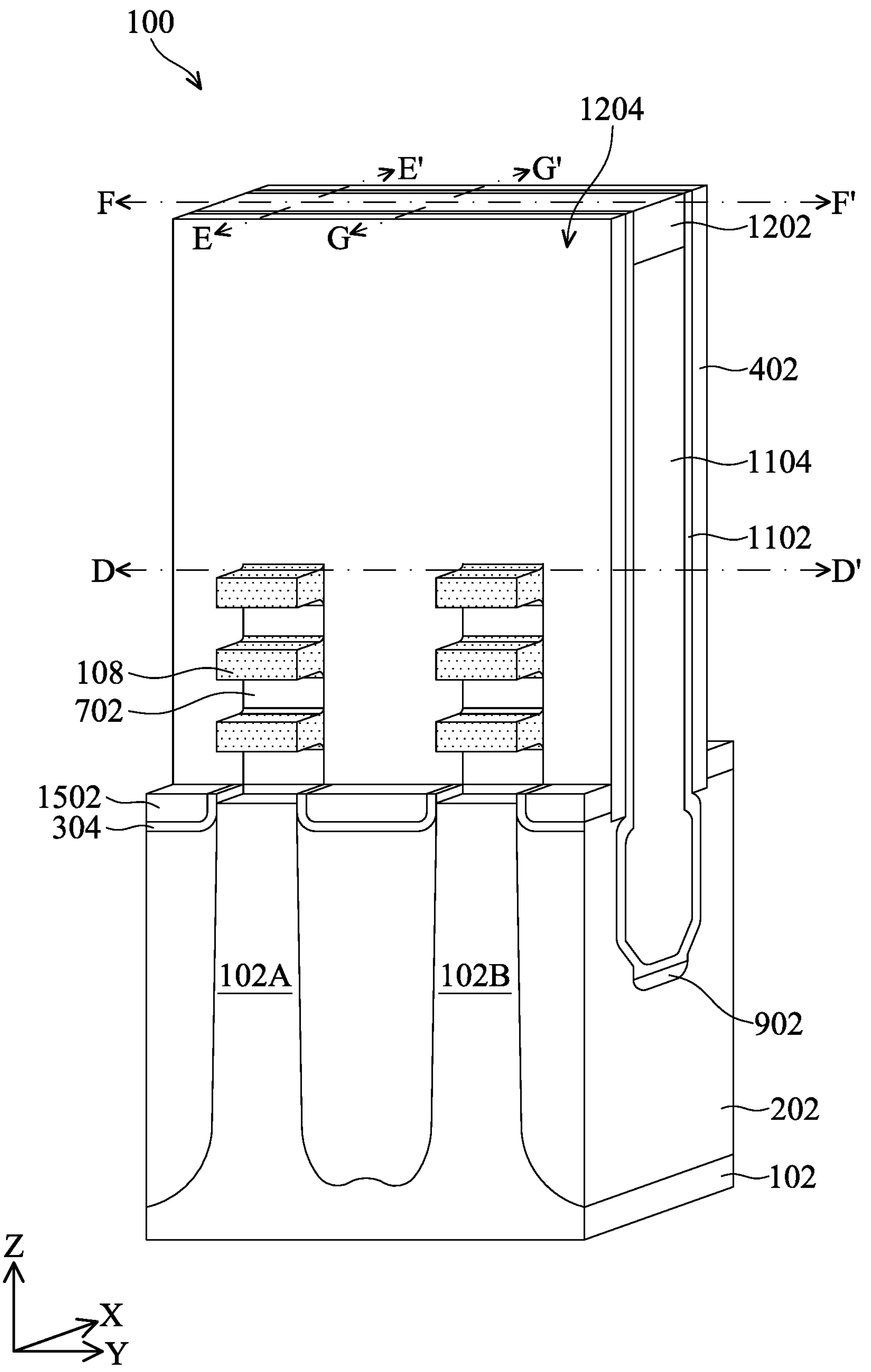

Referring to FIG. 1V, the semiconductor layers 106 of the fins 110 are selectively removed through the gate trenches 1204, using a wet or dry etching process for example, so that the semiconductor layers 108 are exposed in the gate trench 1402 to form nanostructures stacked over each other, which serving as channels, channel layers, or channel members for resultant transistors. As such, the semiconductor layers 108 may be referred to as nanostructures. Specifically, the semiconductor layers 108 are stacked over each other in the Z-direction. Such a process may also be referred to as a release process, a channel release process, a wire release process, a nanowire release process, a nanosheet release process, a nanowire formation process, a nanosheet formation process, or a wire formation process. In some embodiments, the removal of the semiconductor layers 106 causes the exposed semiconductor layers 108 to be spaced apart from each other in the vertical direction (e.g., in the Z-direction). The exposed semiconductor layers 108 extend longitudinally in the horizontal direction (e.g., in the X-direction). Furthermore, each of the semiconductor layers 108 connects one source/drain feature 1002N/1002P to another source/drain feature 1002N/1002P (e.g., shown in FIG. 1W-2). In some embodiments, as shown in FIG. 1V, thicknesses of the semiconductor layers 108 exposed in the gate trench 1402 may be reduced during the removing of the semiconductor layers 106. Further, heights of the base fins 102A and 102B in the gate trench 1204 may also be reduced during the removing of the semiconductor layers 106, such that the top surfaces of the hard mask layers 1502 may be higher than the top surfaces of the base fins 102A and 102B. As the above discussion, the hard mask layers 1502 over the isolation structure 202 prevent the loss of materials of the isolation structure 202 during the removing of the semiconductor layers 106. As such, the height of the isolation structure 202 remains, such that gate structure to be formed may not extend deeply between the base fins 102A and 102B.

Figures 1, 1W:
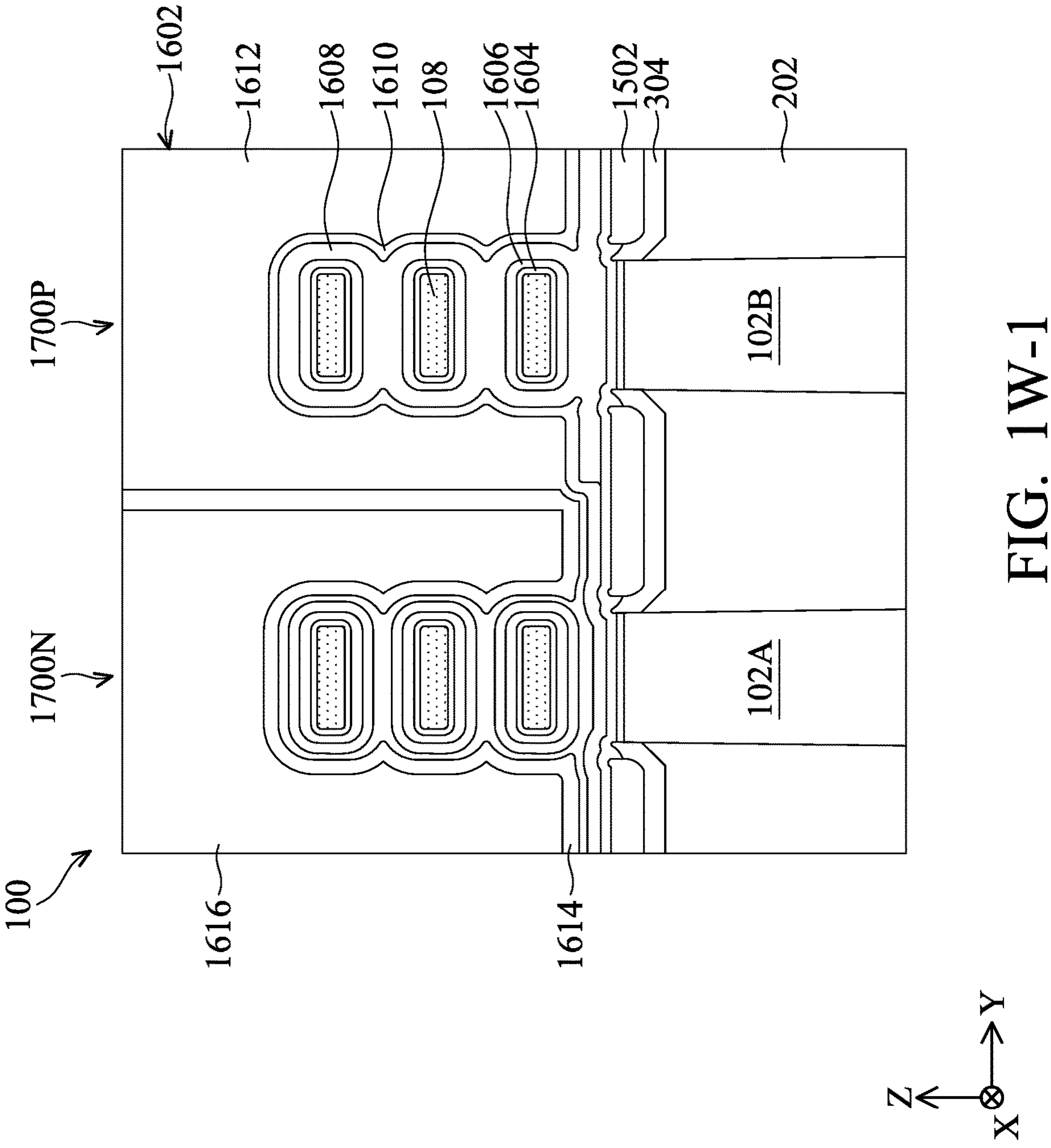
Figures 1, 1W, 2:
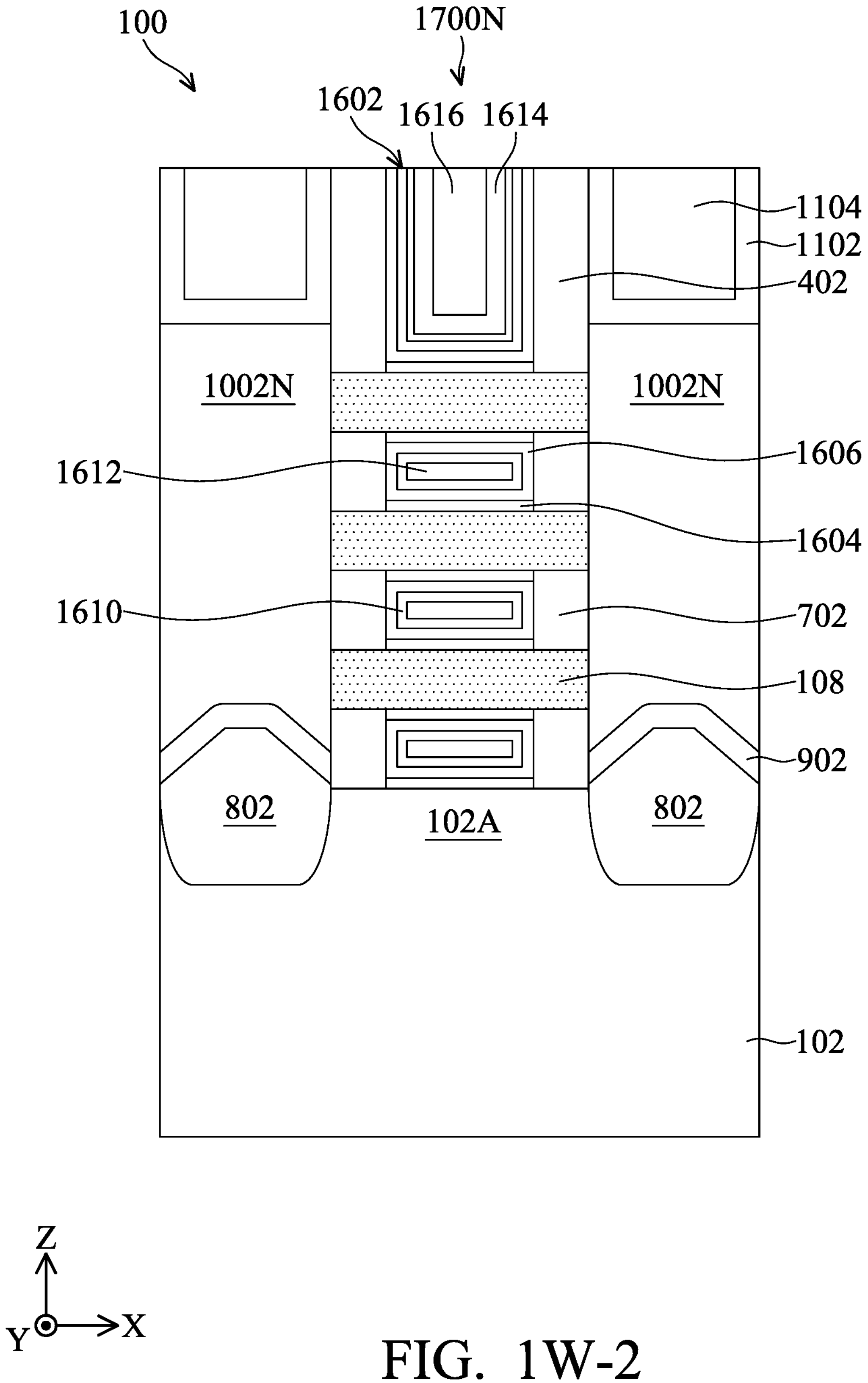

FIGS. 1W-1 to 1W-4 are cross-sectional views of the workpiece 100 at various fabrication stages, in accordance with some embodiments of the present disclosure. FIG. 1W-1 is a Y-Z cross-sectional view of the workpiece 100 at a fabrication stage along a line D-D' of FIG. 1V, in accordance with some embodiments of the present disclosure. FIG. 1W-2 is an X-Z cross-sectional view of the workpiece 100 at a fabrication stage along a line E-E' of FIG. 1V, in accordance with some embodiments of the present disclosure. FIG. 1W-3 is a Y-Z cross-sectional view of the workpiece 100 at a fabrication stage along a line F-F' of FIG. 1V, in accordance with some embodiments of the present disclosure. FIG. 1W-4 is an X-Z cross-sectional view of the workpiece 100 at a fabrication stage along a line G-G' of FIG. 1V, in accordance with some embodiments of the present disclosure.

Referring to FIGS. 1W-1 and 1W-2, a gate structure 1602 is formed in the gate trench 1402 to wrap around the semiconductor layers 108 and be in directly contact with the hard mask layers 1502. As such, the gate structure 1602 replaces the dummy gate structure 302. After the formation of the gate structure 1602, an n-type GAA transistor 1700N and a p-type GAA transistor 1700P are formed. As shown in FIG. 1W-2, the source/drain features 1002N are formed on opposite sides of the gate structure 1602 in the X-direction. It should be noted that the source/drain features 1002P are also formed on opposite sides of the gate structure 1602 in the X-direction. In some embodiments, the n-type GAA transistor 1700N and the p-type GAA transistor 1700P have the same gate structure 1602. In other words, the gate structure 1602 is shared by the n-type GAA transistor 1700N and the p-type GAA transistor 1700P.

The gate structure 1602 includes an interfacial layer 1604, a gate dielectric layer 1606 over the interfacial layer 1604, and work function layers 1608 to 1616 over the gate dielectric layer 1604. In order to form the gate structure 1602, the interfacial layer 1604 is first formed in the gate trench 1204 to wrap around the semiconductor layers 108 and over the base fins 102A and 102B. In some embodiments, the interfacial layer may include a dielectric material such as silicon oxide ($SiO_2$), HfSiO, or silicon oxynitride (SiON). The interfacial layer may be formed by chemical oxidation, thermal oxidation, ALD, CVD, and/or other suitable method.

The gate dielectric layer 1606 is then conformally formed to wrap around the semiconductor layers 108 and the interfacial layer 1604, and formed over the interfacial layer 1604, the dummy interfacial layer 304, and the hard mask layers 1502. Additionally, the gate dielectric layer 1606 also formed on the sidewalls of the inner spacers 702 and the gate spacers 402, as shown in FIGS. 1W-2 and 1W-4. The gate dielectric layer 1606 may include a dielectric material having a dielectric constant greater than a dielectric constant of $SiO_2$, which is approximately 3.9. For example, the gate dielectric layer 1606 may include hafnium oxide ($HfO_2$), which has a dielectric constant in a range from about 18 to about 40. Alternatively, the gate dielectric layer 1606 may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, (Ba, Sr) $TiO_3$ (BST), $Al_2O_3$, $Si_3N_4$, oxynitrides (SiON), combinations thereof, or other suitable material. As such, in some embodiments, the gate dielectric layer 1606 may be referred to as high-k dielectric layer. The gate dielectric layers 1606 may be formed by ALD, PVD, CVD, oxidation, and/or other suitable methods.

The work function layers 1608 to 1616 are formed through lithography, deposition, and etching processes to fill the remaining spaces of the gate trench 1204, and over the gate dielectric layer 1606 in such a way that the work function layers 1608 to 1616 wrap around the semiconductor layers 108, the gate dielectric layer 1606, and the interfacial layer 1604. More specifically, the work function layer 1608 is conformally formed to wrap around the gate dielectric layer 1606 in a region for the p-type GAA transistor 1700P. The work function layer 1610 is then conformally formed to wrap around the work function layer 1608, and wrap around the gate dielectric layer 1606 in a region for the n-type GAA transistor 1700N. The work function layer 1612 is then formed to fill the remaining space in the gate trench 1204 in the region for the p-type GAA transistor 1700P, and conformally formed to wrap around the work function layer 1610 in the region for the n-type GAA transistor 1700N, as shown in FIG. 1W-1. The work function layer 1614 is then conformally formed to wrap around the work function layer 1612 in the region for the n-type GAA transistor 1700N. The work function layer 1616 is then formed to fill the remaining space in the gate trench 1204 for the n-type GAA transistor 1700N. After the formation of the work function layers 1608 to 1616, a CMP process and/or other planarization process is performed on the work function layers 1608 to 1616, the gate spacers 402, the CESL 1102, the ILD layer 1104, the ILD protection layer 1202 until the top surfaces of them are substantially level. In some embodiments, the ILD protection layer 1202 is removed after the CMP process and/or other planarization process, as show in FIGS. 1W-3 and 1W-4.

The work function layers 1608 to 1616 include n-type work function metal layer or p-type work function metal layer. In an embodiment, the n-type work function metal layer is a material such as Ti, Al, Ag, Mn, Zr, TiAl, TiAlC, TaC, TaCN, TaSiN, TaAl, TaAlC, TiAlN, other suitable n-type work function materials, or combinations thereof. For example, the n-type work function metal layer may be deposited utilizing ALD, CVD, or the like. However, any suitable materials and processes may be utilized to form the n-type work function metal layer. In an embodiment, the p-type work function metal layer may be a material such as TiN, TaN, Ru, Mo, Al, WN, ZrSi2, MoSi2, TaSi2, NiSi2, WN, other metal oxides, metal nitrides, metal silicates, transition metal-oxides, transition metal-nitrides, transition metal-silicates, oxynitrides of metals, metal aluminates, zirconium silicate, zirconium aluminate, other suitable p-type work function materials, combinations of these, or the like. Additionally, the p-type work function metal layer may be deposited using a deposition process such as ALD, CVD, or the like, although any suitable deposition process may be used. As the above discussion, the hard mask layers 1502 may be formed from the hard mask material 1302 including work function materials. In some embodiments, the hard mask layers 1502 and the work function layers 1608 to 1616 are made of different materials. For examples, the hard mask layers 1502 are made of dielectric materials, such as $Al_2O_3$, SiN, SiCN, SiOCN, SiOC, SiON, or combinations thereof. In other embodiments, the hard mask layers 1502 and one of the work function layers 1608 to 1616 are made of the same material, such as the work function materials discussed above.

As the above discussion, the hard mask layers 1502 over the isolation structure 202 prevent the loss of materials of the isolation structure 202 during the removing of the semiconductor layers 106. Therefore, as shown in FIG. 1W-4, the top surface of the isolation structure 202 in the source/drain region is lower than the top surface of the isolation structure 202 in the channel region. After the formation of the gate structure 1602, the hard mask layers 1502 are vertically sandwiched between the isolation structure 202 and the gate structure 1602 (in the Z-direction), as shown in FIG. 1W-1. In some embodiments, the hard mask layers 1502 are laterally sandwiched between the gate spacers 402 (in the X-direction), as shown in FIG. 1W-4. The gate structure 1602 is separated from the isolation structure 202 by the hard mask layers 1502 and the dummy interfacial layer 304. Due to the hard mask layers 1502 prevents the loss of materials of the isolation structure 202, the gate structure 1602 is formed over the base fins 102A and 102B without extending deeply between the base fins 102A and 102B (in the Y-direction in the Y-Z cross-sectional view, as shown in FIG. 1W-1). As such, in some embodiments, bottom surfaces of the gate structure 1602 in contact with the hard mask layers are higher than top surfaces of the isolation structure 202, as shown in FIG. 1W-1. Therefore, parasitic capacitances laterally between the gate structure 1602 and the base fins 102A/102B are prevented. In some embodiments, the bottom surfaces of the gate structure 1602 in contact with the hard mask layers 1502 are substantially level with the top surfaces of the base fins 102A and 102B, as shown FIG. 2.

FIGS. 2 to 5 are Y-Z cross-sectional views of the workpiece along the line D-D' of FIG. 1V, in accordance with some embodiments of the present disclosure. Referring back to FIG. 1W-1, the top surfaces of the hard mask layers 1502 are higher than the top surfaces of the base fins 102A and 102B, as discussed above. Referring to FIG. 2, in some embodiments, the hard mask layers 1502 and the base fins 102A and 102B are etched into the same level during the formation of the hard mask layers 1502 (may etch the hard mask layers 1502, as shown in FIG. 1T) and/or the removing of the semiconductor layers 106 (may etch the hard mask layers 1502 and/or the base fins 102A and 102B, as shown in FIG. 1V). Therefore, the top surfaces of the hard mask layers 1502 are substantially level with the top surfaces of the base fins 102A and 102B, as shown in FIG. 2. As such, the bottom surfaces of the gate structure 1602 in contact with the hard mask layers 1502 are substantially level with the top surfaces of the base fins 102A and 102B.

Figures 1, 1W, 2, 3:
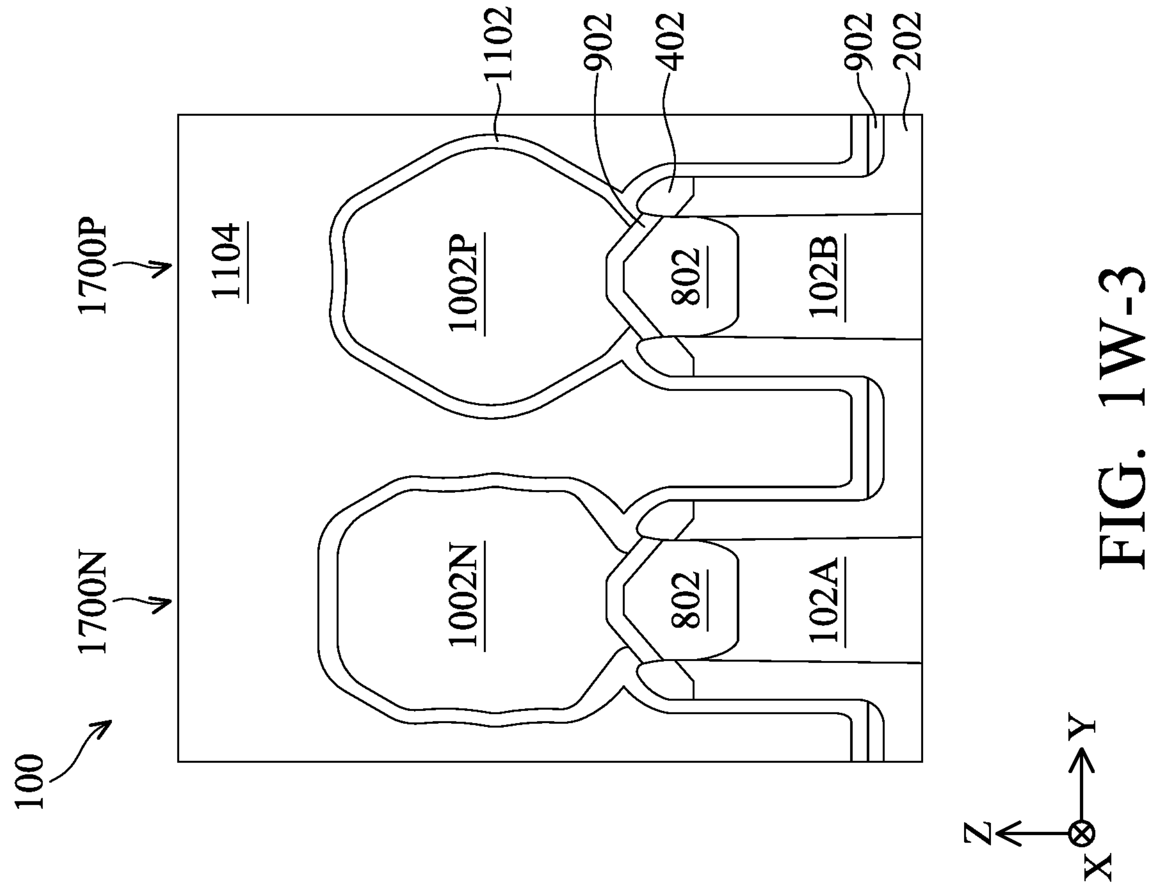
Figures 1, 1W, 2, 3, 4:
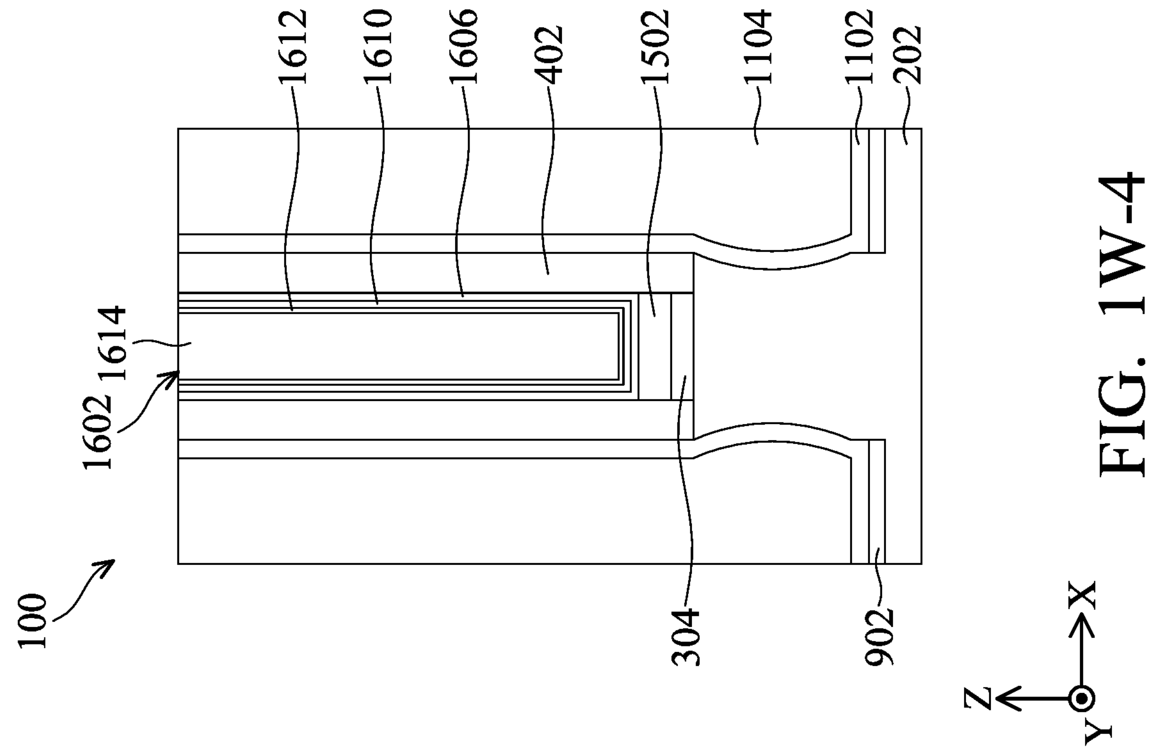
Figure 2:
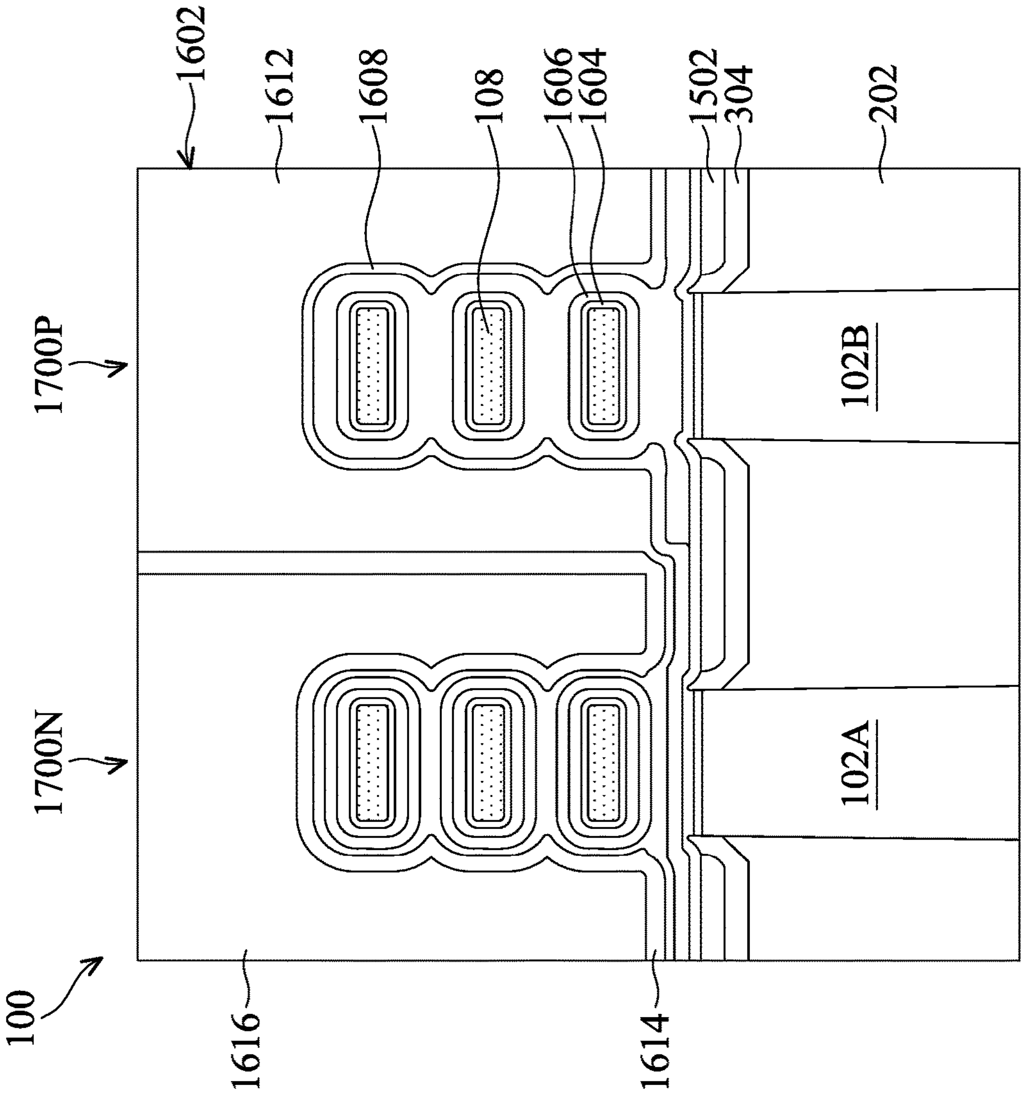
Figure 3:
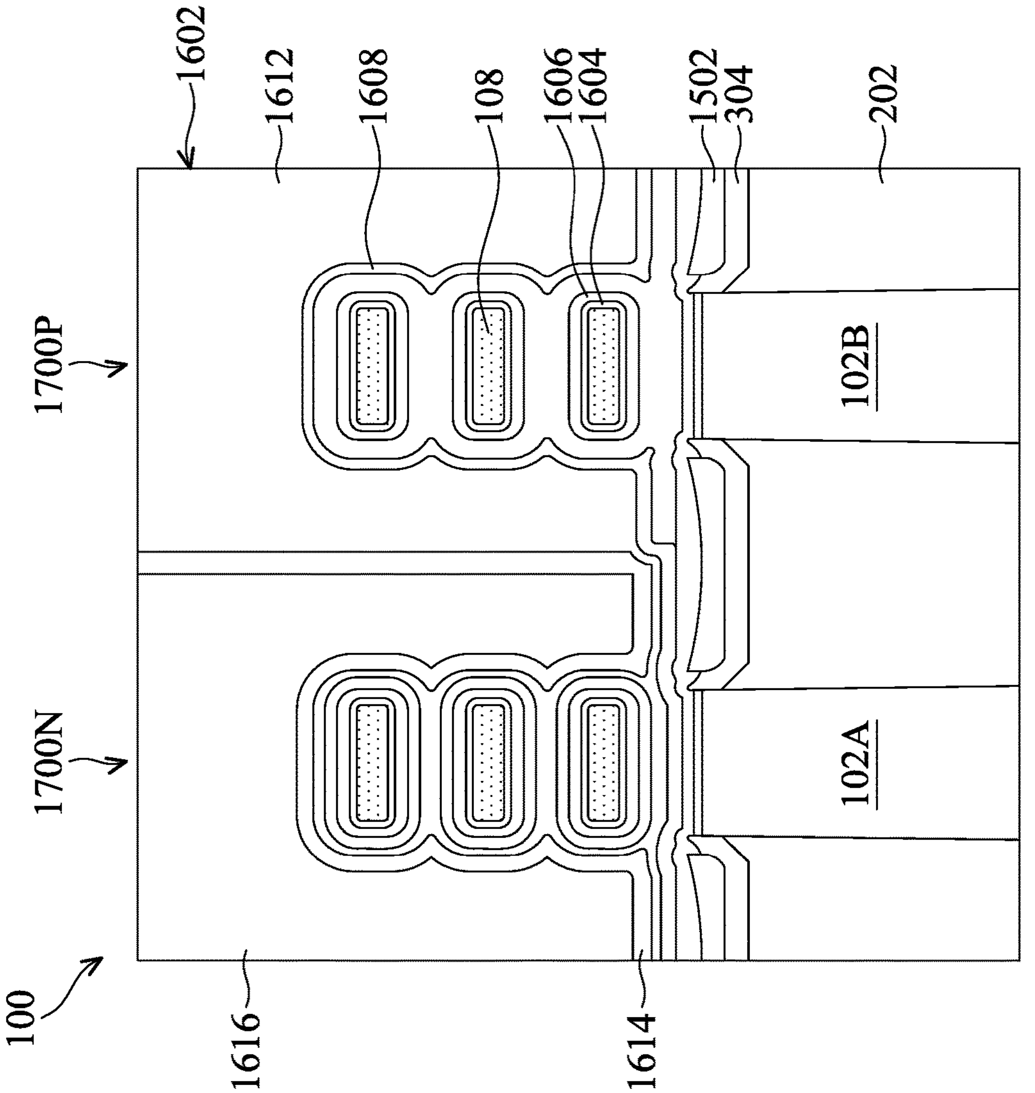
Figure 4:
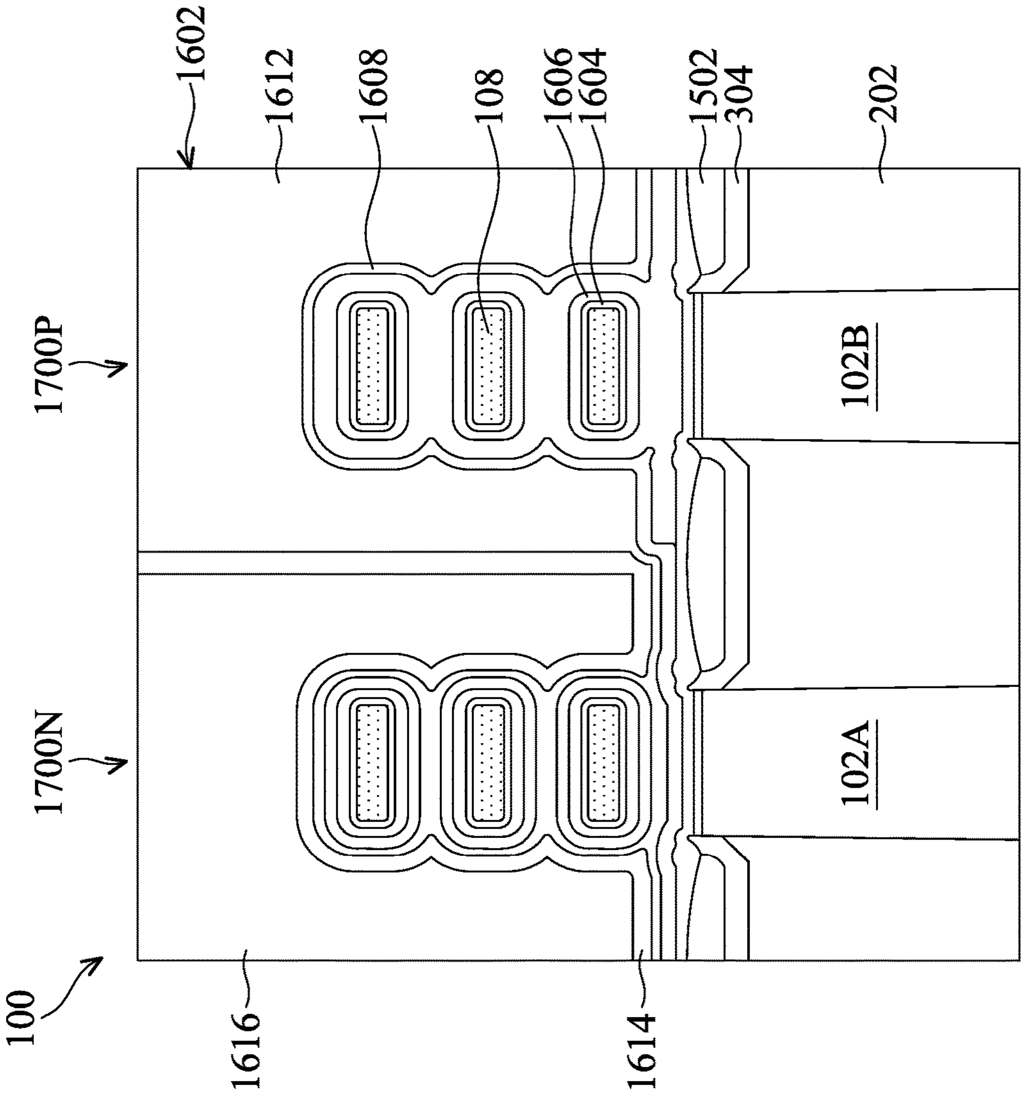

In some embodiments, the top surfaces of the hard mask layers 1502 have different top surface profiles. More specifically, the hard mask layers 1502 are etched to have different top surface profiles during the formation of the hard mask layers 1502 (may etch the hard mask layers 1502, as shown in FIG. 1T) and/or the removing of the semiconductor layers 106. For examples, the top surfaces of the hard mask layers 150 are flat or planar surfaces, as shown in FIG. 1W-1, and thus the bottom surfaces of the gate structure 1602 in contact with the hard mask layers 1502 are also flat or planar surfaces. In some embodiments, the top surfaces of the hard mask layers 150 may be concave surfaces, and thus the bottom surfaces of the gate structure 1602 in contact with the hard mask layers 1502 are convex surfaces, as shown in FIG. 3. In other embodiments, the top surfaces of the hard mask layers 150 may be convex surfaces, and thus the bottom surfaces of the gate structure 1602 in contact with the hard mask layers 1502 are concave surfaces, as shown in FIG. 4.

Figure 5:
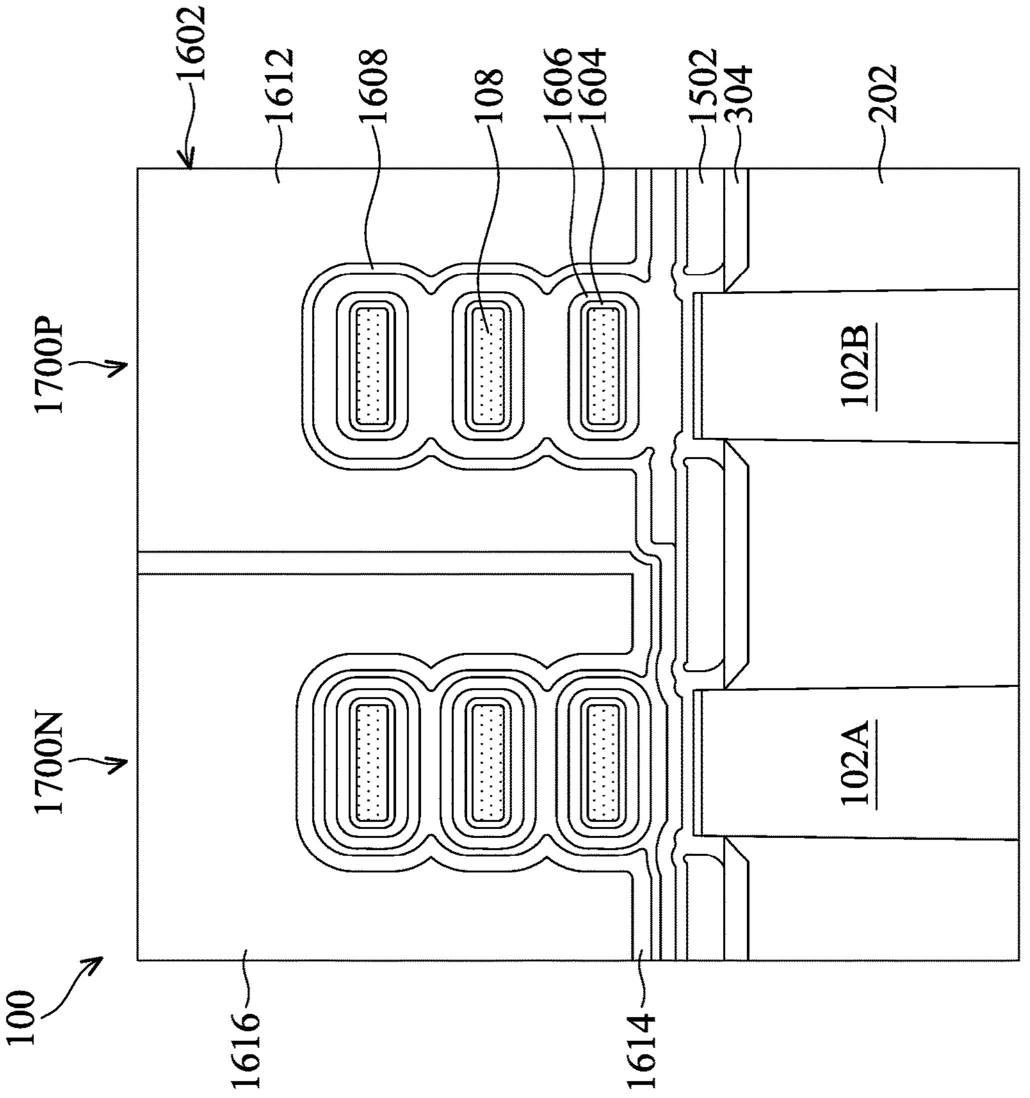
FIG. 5 is a Y-Z cross-sectional view of the workpiece along a line D-D' of FIG. 1V, in accordance with some embodiments of the present disclosure.

Referring back to FIG. 1W-1, the dummy interfacial layer 304 is also on the sidewalls of the hard mask layers 1502. In some embodiments, the dummy interfacial layer 304 is not on the sidewalls of the hard mask layers 1502. More specifically, the dummy interfacial layer 304 on the sidewalls of the hard mask layers 1502 are etched or removed during the partially removing of the dummy interfacial layer 304 discussed in FIG. 1U. As such, topmost surfaces of the dummy interfacial layer 304 are below the top surfaces of the base fins 102A and 102B, as shown in FIG. 5. In some aspects, the topmost surfaces of the dummy interfacial layer are substantially level with bottom surfaces of the hard mask layers 1502.

The embodiments disclosed herein relate to semiconductor structures and their manufacturing methods, and more particularly to methods and semiconductor structures comprising hard mask layers over isolation structure to prevent loss of materials of the isolation structure during the formation of transistors. Furthermore, the present embodiments provide one or more of the following advantages. The gate structure formed over the base fins without extending deeply between the base fins provides a lower parasitic capacitance, which improves the performance of the transistors, such as RC delay.

Thus, one of the embodiments of the present disclosure describes a method for manufacturing a semiconductor structure that includes forming fins over a substrate. Each of the fins includes a base fin protruding from the substrate, and first semiconductor layers and second semiconductor layers alternating stacked over the base fin. The method further includes forming an isolation structure between the base fins, forming a hard mask layer over the isolation structure, and removing the second semiconductor layers, so that the first semiconductor layers and the hard mask layer are exposed in a gate trench. The method further includes forming a gate structure in the gate trench. The gate structure wraps around the first semiconductor layers and over the hard mask layer.

In some embodiments, the method further includes forming a dummy gate structure over the fins and the isolation structures. The dummy gate structure has a dummy interfacial layer and a dummy gate electrode over the dummy interfacial layer. The method further includes forming gate spacers on sidewalls of the dummy gate structure, and removing the dummy gate electrode to form the gate trench before forming the hard mask layer. The dummy interfacial layer is between the hard mask layer and the isolation structure after forming the hard mask layer.

In some embodiments, the hard mask layer is separated from the base fins by the dummy interfacial layer.

In some embodiments, the formation of the hard mask layer further includes forming a hard mask material on sidewalls of the fins and over top surfaces of the isolation structure and the fins, forming a bottom anti-reflective coating layer over the hard mask material between the fins, removing the hard mask material on top portions of the sidewalls of the fins, removing the bottom anti-reflective coating layer, and removing the hard mask material on bottom portions of the sidewalls of the fins to form the hard mask layer.

In some embodiments, the formation of the gate structure further includes forming a gate dielectric layer wrapping around the first semiconductor layers and over the hard mask layer, and forming work function layers wrapping around the gate dielectric layer.

In some embodiments, a top surface of the hard mask layer is higher than a top surface of the base fins.

In some embodiments, a top surface of the hard mask layer is substantially level with a top surface of the base fins.

In some embodiments, the hard mask layer is formed by physical vapor deposition.

In some embodiments, the hard mask layer is made of Ti, Al, Ag, Mn, Zr, TiAl, TiAlC, TaC, TaCN, TaSiN, TaAl, TaAlC, TiAlN, TiN, TaN, Ru, Mo, Al, WN, ZrSi2, MoSi2, TaSi2, NiSi2, WN, or combinations thereof.

In some embodiments, the hard mask layer is made of $Al_2O_3$, SiN, SiCN, SiOCN, SiOC, SiON, or combinations thereof.

In another of the embodiments, discussed is a method for manufacturing a semiconductor structure including forming fins over a substrate. The fins include first semiconductor layers and second semiconductor layers alternating stacked. The method further includes forming an isolation structure around the fins, forming a dummy interfacial layer over the fins and the isolation structures, forming a dummy gate electrode over the dummy interfacial layer, removing the dummy gate electrode to form a gate trench exposing the dummy interfacial layer, forming a hard mask layer covering the dummy interfacial layer over the isolation structure, removing the second semiconductor layers in the gate trench, and forming a gate structure in the gate trench. The gate structure wraps around the first semiconductor layers and directly contacts the hard mask layers.

In some embodiments, the formation of the hard mask layer further includes forming a hard mask material covering the dummy interfacial layer, forming a bottom anti-reflective coating layer over the hard mask material between the fins, removing a first portion of the hard mask material not covered by the bottom anti-reflective coating layer, removing the bottom anti-reflective coating layer, and removing a second portion of the hard mask material to form the hard mask layer over the isolation structure.

In some embodiments, the dummy interfacial layer is on sidewalls of the hard mask layer.

In some embodiments, a bottom surface of the gate structure in contact with the hard mask layer is higher than a top surface of the base fins.

In some embodiments, a bottom surface of the gate structure in contact with the hard mask layer is substantially level with a top surface of the base fins.

In some embodiments, the hard mask layer is formed from Ti, Al, Ag, Mn, Zr, TiAl, TiAlC, TaC, TaCN, TaSiN, TaAl, TaAlC, TiAlN, TiN, TaN, Ru, Mo, Al, WN, ZrSi2, MoSi2, TaSi2, NiSi2, WN, or combinations thereof.

In yet another of the embodiments, discussed is a semiconductor structure that includes base fins, nanostructures, source/drain features, an isolation structure, a gate structure, gate spacers, and a hard mask layer. The base fins protrude from a substrate. The nanostructures are over the base fins. The source/drain features are connected to the nanostructures in source/drain regions. The isolation structure is between the base fins. The gate structure wraps around the nanostructures and is over base fins in a channel region. The gate spacers are on opposite sidewalls of the gate structure. The hard mask layer is vertically sandwiched between the isolation structure and the gate structure and laterally sandwiched between the gate spacers.

In some embodiments, a top surface of the isolation structure in the source/drain region is lower than a top surface of the isolation structure in the channel region.

In some embodiments, the gate structure further includes a high-k dielectric layer and work function layers. The high-k dielectric layer wraps around the nanostructures and over the hard mask layers. The work function layers wrap around the high-k dielectric layer. One of the work function layers and the hard mask layer are made of the same material.

In some embodiments, a thickness of the hard mask layer is in a range from about 1 nm to about 5 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming fins over a substrate, wherein each of the fins comprises a base fin protruding from the substrate, and first semiconductor layers and second semiconductor layers alternating stacked over the base fin;

forming an isolation structure between the base fins;

forming a hard mask layer over the isolation structure;

removing the second semiconductor layers, so that the first semiconductor layers and the hard mask layer are exposed in a gate trench; and forming a gate structure in the gate trench, wherein the gate structure wraps around the first semiconductor layers and over the hard mask layer, wherein a top surface of the hard mask layer is lower than bottom-most surfaces of the first semiconductor layers.

2. The method of claim 1, further comprising:

forming a dummy gate structure over the fins and the isolation structure, wherein the dummy gate structure has a dummy interfacial layer and a dummy gate electrode over the dummy interfacial layer;

forming gate spacers on sidewalls of the dummy gate structure; and removing the dummy gate electrode to form the gate trench before forming the hard mask layer, wherein the dummy interfacial layer is between the hard mask layer and the isolation structure after forming the hard mask layer.

3. The method of claim 2, wherein the hard mask layer is separated from the base fins by the dummy interfacial layer.

4. The method of claim 1, wherein the formation of the hard mask layer further comprises:

forming a hard mask material on sidewalls of the fins and over top surfaces of the isolation structure and the fins;

forming a bottom anti-reflective coating layer over the hard mask material between the fins;

removing the hard mask material on top portions of the sidewalls of the fins;

removing the bottom anti-reflective coating layer; and removing the hard mask material on bottom portions of the sidewalls of the fins to form the hard mask layer.

5. The method of claim 1, wherein the formation of the gate structure further comprises:

forming a gate dielectric layer wrapping around the first semiconductor layers and over the hard mask layer; and forming work function layers wrapping around the gate dielectric layer.

6. The method of claim 1, wherein a top surface of the hard mask layer is higher than a top surface of the base fins.

7. The method of claim 1, wherein a top surface of the hard mask layer is substantially level with a top surface of the base fins.

8. The method of claim 1, wherein the hard mask layer is formed by physical vapor deposition.

9. The method of claim 1, wherein the hard mask layer is made of Ti, Al, Ag, Mn, Zr, TiAl, TiAlC, TaC, TaCN, TaSiN, TaAl, TaAlC, TiAlN, TiN, TaN, Ru, Mo, Al, WN, ZrSi2, MoSi2, TaSi2, NiSi2, WN, or combinations thereof.

10. The method of claim 1, wherein the hard mask layer is made of Al2O3, SiN, SiCN, SiOCN, SiOC, SiON, or combinations thereof.

11. A method for manufacturing a semiconductor structure, comprising:

forming fins over a substrate, wherein the fins comprise first semiconductor layers and second semiconductor layers alternating stacked over base fins;

forming an isolation structure around the fins;

forming a dummy interfacial layer over the fins and the isolation structure;

forming a dummy gate electrode over the dummy interfacial layer;

removing the dummy gate electrode to form a gate trench exposing the dummy interfacial layer;

forming a hard mask layer covering the dummy interfacial layer over the isolation structure;

removing the second semiconductor layers in the gate trench; and forming a gate structure in the gate trench, wherein the gate structure wraps around the first semiconductor layers and interfaces the hard mask layers and the dummy interfacial layer.

12. The method of claim 11, wherein the formation of the hard mask layer further comprises:

forming a hard mask material covering the dummy interfacial layer;

forming a bottom anti-reflective coating layer over the hard mask material between the fins;

removing a first portion of the hard mask material not covered by the bottom anti-reflective coating layer;

removing the bottom anti-reflective coating layer; and removing a second portion of the hard mask material to form the hard mask layer over the isolation structure.

13. The method of claim 11, wherein the dummy interfacial layer is on sidewalls of the hard mask layer.

14. The method of claim 11, wherein a bottom surface of the gate structure in contact with the hard mask layer is higher than a top surface of the base fins.

15. The method of claim 11, wherein a bottom surface of the gate structure in contact with the hard mask layer is substantially level with a top surface of the base fins.

16. The method of claim 11, wherein the hard mask layer is formed from Ti, Al, Ag, Mn, Zr, TiAl, TiAlC, TaC, TaCN, TaSiN, TaAl, TaAlC, TiAlN, TIN, TaN, Ru, Mo, Al, WN, ZrSi2, MoSi2, TaSi2, NiSi2, WN, or combinations thereof.

17. A method for manufacturing a semiconductor structure, comprising:

forming fins over a substrate, wherein each of the fins comprises a base fin protruding from the substrate, and first semiconductor layers and second semiconductor layers alternating stacked over the base fin;

forming an isolation structure around the base fins;

forming a dummy gate structure over the fins and the isolation structure, wherein the dummy gate structure has a dummy interfacial layer and a dummy gate electrode over the dummy interfacial layer;

forming source/drain features on opposite sides of the dummy gate structure;

removing the dummy gate electrode to form a gate trench;

forming a hard mask layer over the isolation structure and the dummy interfacial layer;

removing the second semiconductor layers in the gate trench; and forming a gate structure in the gate trench, wherein the gate structure wraps around the first semiconductor layers and over the hard mask layer, wherein a bottom surface of the hard mask layer is lower than top surfaces of the base fins of the fins.

18. The method of claim 17, wherein the formation of the hard mask layer further comprises:

forming a hard mask material over the dummy interfacial layer;

forming a bottom anti-reflective coating layer over the hard mask material and between the fins;

partially removing the hard mask material exposed in the gate trench;

removing the bottom anti-reflective coating layer; and partially removing the hard mask material to form the hard mask layer over the isolation structure.

19. The method of claim 17, wherein a thickness of the hard mask layer is in a range from about 1 nm to about 5 nm.

20. The method of claim 17, wherein the formation of gate structure further comprises:

forming a high-k dielectric layer wrapping around the first semiconductor layers and over the hard mask layer; and forming work function layers wrapping around the high-k dielectric layer, wherein one of the work function layers and the hard mask layer are made of the same material.

* * * * *